United States Patent
Terauchi et al.

(10) Patent No.: US 6,720,601 B2
(45) Date of Patent: Apr. 13, 2004

(54) SEMICONDUCTOR DEVICE COMPRISING A GATE CONDUCTIVE LAYER WITH A STRESS MITIGATING FILM THEREON

(75) Inventors: Takashi Terauchi, Hyogo (JP); Akinobu Teramoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/214,600

(22) Filed: Aug. 9, 2002

(65) Prior Publication Data

US 2003/0107071 A1 Jun. 12, 2003

(30) Foreign Application Priority Data

Dec. 10, 2001 (JP) .......................................... 2001-375349

(51) Int. Cl.$^7$ ............................................ H01L 27/108
(52) U.S. Cl. ........................ 257/296; 257/301; 257/302; 257/412; 257/413; 438/270; 438/272
(58) Field of Search ................................ 438/270, 272; 257/301, 302, 412, 413

(56) References Cited

U.S. PATENT DOCUMENTS

| | | | |
|---|---|---|---|
| 6,437,388 B1 | * | 8/2002 | Radens et al. ............... 257/301 |
| 6,440,801 B1 | * | 8/2002 | Furukawa et al. ........... 438/272 |
| 6,521,963 B1 | * | 2/2003 | Ota et al. .................... 257/412 |

* cited by examiner

*Primary Examiner*—David Nelms
*Assistant Examiner*—Mai-Huong Tran
(74) *Attorney, Agent, or Firm*—McDermott, Will & Emery

(57) ABSTRACT

A semiconductor device having a structure in which the amount of stress on a semiconductor substrate or a gate wire is low, even in a case when the sidewalls of the gate wire are formed of a nitride film is obtained. A gate conductive layer positioned above a silicon substrate, a stress mitigating film that covers a sidewall of the gate conductive layer and a sidewall external layer spacer that covers the stress mitigating film and that exposes the upper edge of the stress mitigating film and the side edge of the bottom portion of the stress mitigating film are provided and the stress mitigating film has silicon oxide films positioned in the areas ranging inwardly from the upper edge and from the side edge so as to sandwich the silicon oxide film from both ends.

14 Claims, 22 Drawing Sheets

SEMICONDUCTOR DEVICE COMPRISING A GATE CONDUCTIVE LAYER WITH A STRESS MITIGATING FILM THEREON

BACKGROUND OF THE INVENTION

1. Field of the Invention

The present invention relates to a semiconductor device such as a memory cell transistor.

2. Description of the Background Art

FIG. 36 is a cross sectional view of transistors of an ordinary generic DRAM (Dynamic Random Access Memory) according to a prior art. A gate oxide film 102 is formed beneath a gate electrode and a thermal oxide film 107 is formed in places other than that, above a silicon substrate. Source/drain regions to which an impurity is introduced are placed so as to sandwich a channel region beneath a gate conductive layer. The above described semiconductor device of FIG. 36 is a type wherein a thermal oxide film (lower layer oxide film) 107 is formed on a side of the gate conductive layer and on the silicon substrate. The portion of this thermal oxide film 107 on the side of the gate conductive layer is, in some cases, particularly referred to as sidewall internal layer oxide film.

Next, in reference to FIGS. 37 to 43, a manufacturing method for a transistor shown in FIG. 36 is described. First, an element isolation region is formed in a semiconductor substrate by using a method of filling in a thermal oxide film and an oxide film, or the like. A portion other than the element isolation region becomes an active region. Implantations for a well, a channel, and the like, of the transistor to the active region are carried out. After that a silicon oxide film 102, which becomes a gate oxide film, is formed and a conductive film 103, which becomes a wire, is layered on top of the oxide film. An insulating film 104 for the protection of the wire is formed on top of the conductive film (FIG. 37).

Next, a photoresist mask 105 of a desired gate wire pattern is applied (FIG. 38) according to a photomechanical process. Next, insulating film 104 is formed into a desired pattern (FIG. 39) by using dry etching, primarily of the oxide film, by means of an RIE (reactive ion etching) method, or the like. Dry etching, primarily of the polymetal, is carried out by means of an RIE method, or the like, by using insulating film 104 as a mask so as to form a gate wire form. Etching at this time is, in general, carried out under the condition of having a high etching selection ratio relative to silicon oxide film. Therefore, etching stops in the gate oxide film 102 (FIG. 40). Next, impurities such as P or As in the order of $10^{13}$ to $10^{14}$ atoms/cm$^2$ are implanted into source/drain regions 106 of the transistor (FIG. 41).

Next, a thermal oxidation process is carried out so as to cover the sidewalls of the gate wire and the substrate with a thermal oxide film (layer oxide film) 107 (FIG. 42).

Next, a gate protective film 108 of an insulating film is deposited in order to protect a sidewall of the gate wire. An insulating film having a high etching selection ratio at the time of the dry etching of the oxide film by means of an RIE method, or the like, is used for this gate protective film 108. This is usually a nitride film or an oxy-nitride (SiN$_x$O$_y$) film that is deposited by means of a CVD (chemical vapor deposition) method. In either case, the film thickness is 10 nm to 100 nm (FIG. 43). Next, dry etching, of primarily the oxide film, is carried out on the entire surface by means of an RIE method, or the like, so that a sidewall 9 of a nitride film or an oxy-nitride film is formed.

When sidewalls of a nitride film or an oxy-nitride film are formed as shown in FIG. 43, stress given by these sidewalls becomes a problem. The stress acting on the semiconductor substrate increases the leak current of the transistor and causes the deterioration of the refreshing characteristics. In addition, the stress acting on the gate wires lowers the driving ability of the transistor.

In particular, in recent years miniaturization has progressed and high melting point metal films have come into use as wire materials in order to lower wire resistance. However, high melting point metal films have a high sensitivity to thermal oxidation processes and yield unfavorable results when a thermal oxidation process is carried out. Accordingly, in the case that a high melting point metal film is used as a conductive material for gate wires, a thermal oxidation process cannot be carried out. The semiconductor device shown in FIG. 44 is a semiconductor device of this type. Since a thermal oxidation process cannot be carried out, a sidewall external layer spacer 109 contacts a gate conductive layer 103. In addition, the oxide film positioned between the nitride film of the sidewall external layer spacer and the silicon substrate remains thin. As a result of this, stress acting on the semiconductor substrate and the gate wires becomes greater in comparison with the semiconductor device of the type wherein a lower layer oxide film is provided. Therefore, the driving ability and refreshing characteristics of the transistor are caused to deteriorate and a problem arises wherein the leak current increases.

SUMMARY OF THE INVENTION

An object of the present invention is to provide a semiconductor device having a structure in which stress acting on the semiconductor substrate or the gate wires is reduced, even in the case that a sidewall of a gate wire is formed of a nitride film, or the like.

A semiconductor device of the present invention is provided with: a gate conductive layer positioned on a silicon substrate; a stress mitigating film including a silicon film which covers a sidewall of said gate conductive layer and the silicon substrate beneath the gate conductive layer; and a sidewall external layer spacer covering the stress mitigating film and exposing an upper edge of the stress mitigating film in an upper portion of the sidewall of the gate conductive layer and a side edge of a bottom portion of the stress mitigating film in a lower portion of the gate conductive layer, wherein the stress mitigating film has silicon oxide films positioned in an area ranging inwardly from the upper edge and from the side edge so as to sandwich the silicon film from both ends.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Next, the embodiments of the present invention are described in reference to the drawings.

First Embodiment

Figure 1:
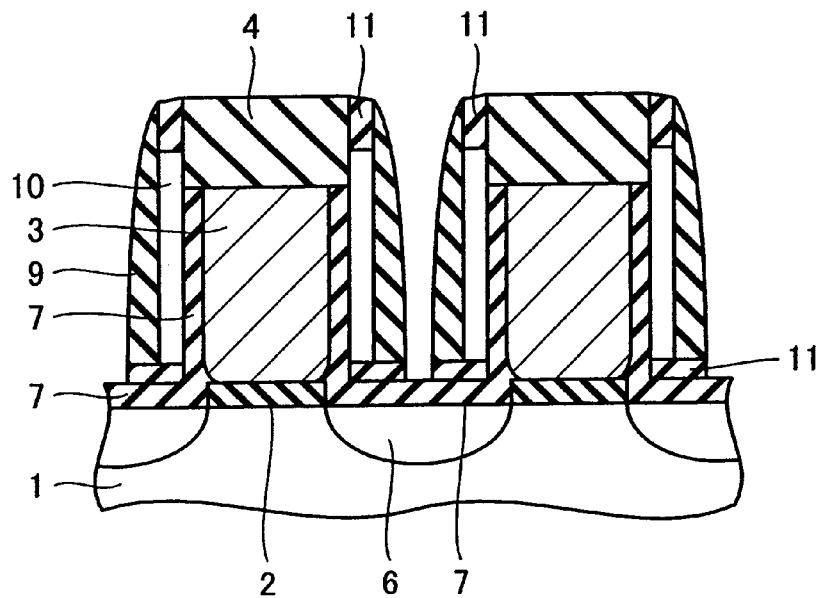
FIG. 1 is a cross sectional view of a semiconductor device according to the first embodiment of the present invention.

In reference to FIG. 1, source/drain regions 6 to which an impurity has been introduced are formed in a silicon substrate 1. A gate oxide film 2 is placed on silicon substrate 1 and gate conductive layer 3 and a protective insulating layer 4 are provided on top of the above. An oxide film 7 that is formed by means of a thermal oxidation process is placed on a sidewall of gate conductive layer 3 and, in a continuous manner, on a portion of the silicon substrate adjoining the bottom of the gate. A polycrystal silicon film 10 is placed so as to cover the outside of this oxide film 7 and a sidewall external layer spacer 9 made of a nitride film is provided further outside thereof.

Silicon oxide films 11 formed by oxidizing two locations of a polycrystal silicon film at the upper edge and at the side edge of the bottom portion of the film that is continuous with polycrystal silicon film 10 are formed so as to extend inwardly.

Next, a manufacturing method for a semiconductor device of the present embodiment is described. First, an element isolation region is formed in a semiconductor substrate by using a filling in method, or the like, of a thermal oxide film and an oxide film. After that, a silicon oxide film 2 that becomes a gate oxide film is formed and a conductive film 3 that becomes a gate conductive layer, which is a wire, is layered on top of the above (see FIG. 2). An insulating film 4, which protects the wire, is formed on top of the above. Gate oxide film 2 is a non-doped silicon oxide film deposited by using a low pressure CVD method or a normal pressure CVD method and the film thickness thereof is 2 nm to 10 nm. Conductive film 3 is made of polycrystal silicon or of amorphous silicon deposited by means of a CVD method and P, As or B is doped therein or it is made of a high melting point metal film, such as of TiN or W, or is a silicide film made of these or a layered film of silicon and any of these. In any case, the film thickness is 40 nm to 300 nm. Insulating film 4 is made of an insulating film that has a high etching selection ratio relative to a silicon oxide film at the time when the silicon oxide film dry etching by means of an RIE (reactive ion etching) method, or the like. Conventionally, a nitride film, a nitride oxide film or a layered film of these that is deposited by means of a CVD method is used. A two-layered film of an oxide film and a nitride film may be used. The film thickness is 20 nm to 100 nm in all cases.

Next, a photoresist mask of a desired gate wire pattern is applied by means of a photomechanical process. Next, dry etching, primarily of the oxide film, is used so as to form insulating film 4 into a desired pattern by means of an RIE method, or the like. Next, dry etching, primarily of the polymetal, is carried out by means of an RIE method, or the like by using patterned insulating film 4 as a mask so as to form a gate wire form. Etching at this time is carried out, in general, under the condition of having a high etching selection ratio relative to a silicon oxide film. Therefore, etching stops in the middle of gate oxide film 2. Next, an impurity, such as P or As, is implanted in the order of $10^{13}$ to $10^{14}$ atoms/cm$^2$ into source/drain regions 6 of a transistor.

Next, a thermal oxidation process is carried out and a sidewall of the gate wire and a surface of the substrate are covered with a thermal oxide film 7. Through the formation of this thermal oxide film 7, a gate edge is rounded according to the thermal oxide film. Therefore, the occurrence of hot carriers due to the concentration of the electrical field at the gate edge can be prevented. In addition, the effects can be gained wherein etching damage that has occurred at the time of gate wire formation and damage that has occurred at the time of impurity implantation into the source/drain regions is repaired. As for the above described thermal oxidation process, there are a dry reflow that carries out a thermal treatment in an oxygen atmosphere and a wet reflow that carries out a thermal treatment in an H$_2$O atmosphere. In either case, thermal oxidation is carried out at a temperature of 700° C. to 1200° C. The film thickness of the formed thermal oxide film is approximately 5 nm to 20 nm.

Figure 2:
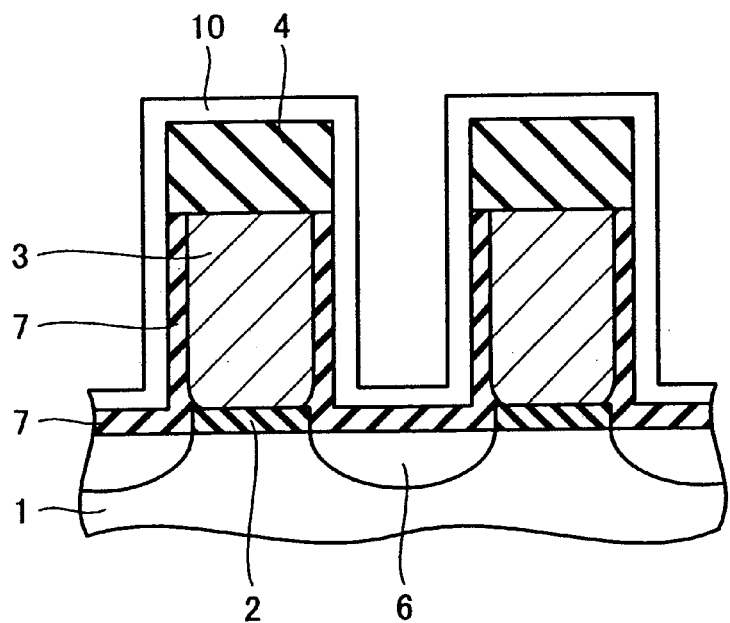
FIG. 2 is a cross sectional view at the stage wherein a polycrystal silicon film is deposited in the manufacture of the semiconductor device of FIG. 1.

Next, as shown in FIG. 2, a polycrystal silicon film or an amorphous silicon film 10 is deposited by means of a CVD method. This silicon film 10 may be doped with an impurity, such as P, As or B, or may be non-doped. The film thickness is 5 nm to 20 nm in both cases.

Figure 3:
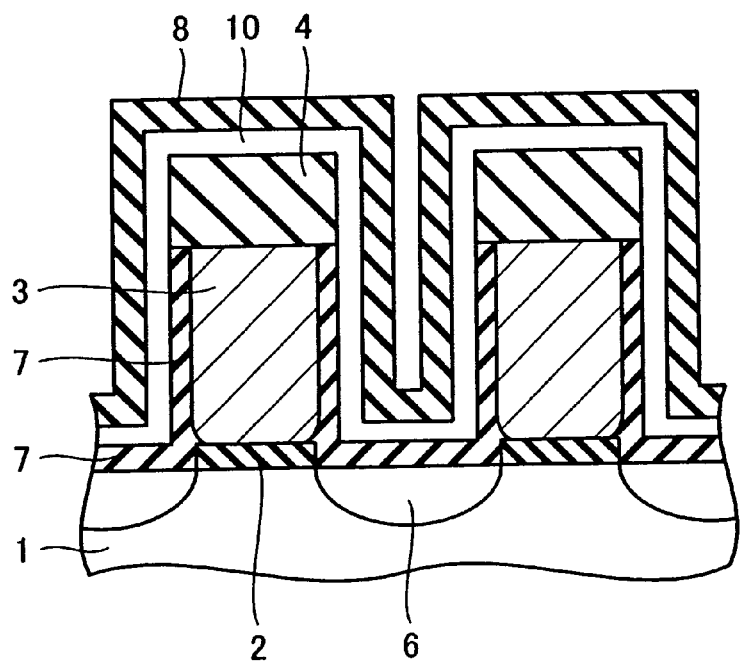
FIG. 3 is a cross sectional view at the stage wherein a protective film is deposited.

Next, an insulating film 8 for protecting a sidewall of a gate wire is deposited. This insulating film 8 is made of an insulating film that has a sufficiently high etching selection ratio at the time of the dry etching of the oxide film by means of RIE, or the like. Here, a nitride film or a nitride oxide film deposited by means of a CVD method is used. The film thickness is 10 nm to 100 nm in both cases (FIG. 3).

Figure 4:
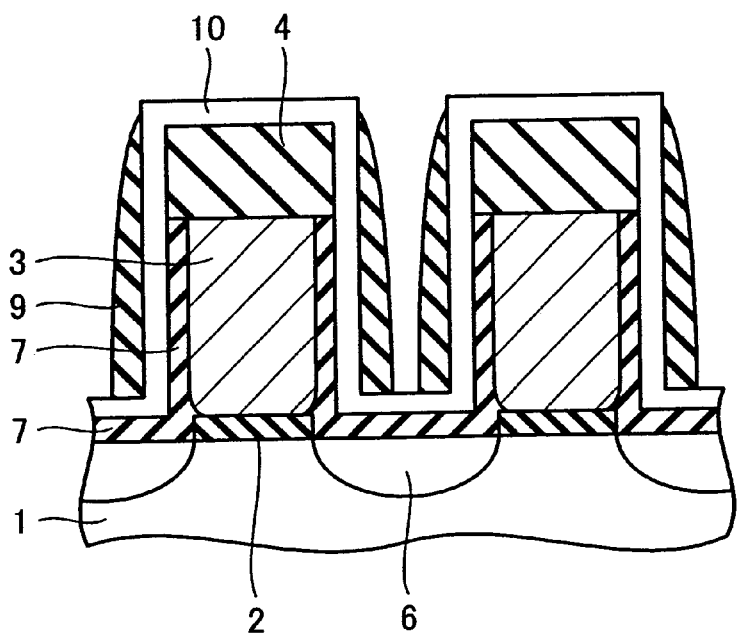
FIG. 4 is a cross sectional view at the stage wherein sidewall external layer spacers are formed through etching.

After that, dry etching, primarily of the oxide film, is carried out on the entire surface by means of an RIE method, or the like, so that a sidewall external layer spacer 9 of a nitride film is formed. At this time, etching is carried out so that nitride film or nitride oxide film 8 does not remain on polycrystal silicon film 10 in portions other than on the sidewall external layer spacers (FIG. 4).

Figure 5:
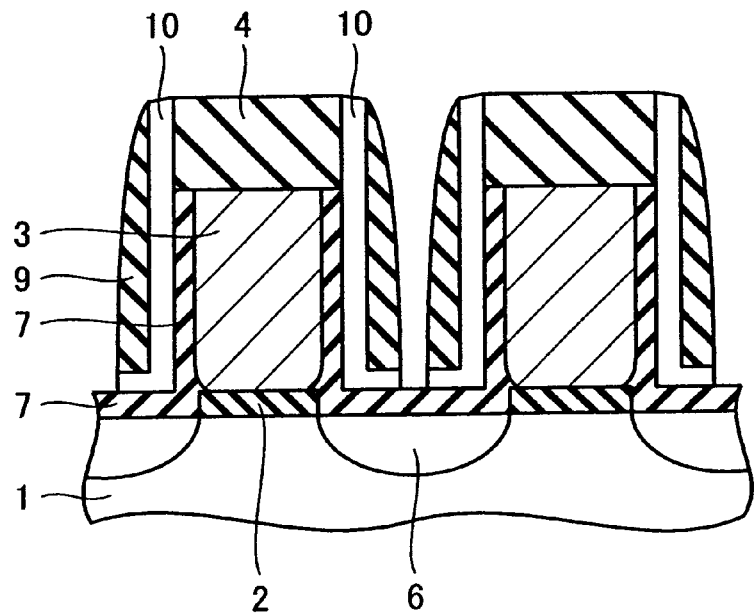
FIG. 5 is a cross sectional view at the stage wherein etching is carried out so as to expose only the edge surfaces of polycrystal silicon oxide films.

Next, exposed polycrystal silicon film 10 is removed through dry etching, primarily of the polycrystal silicon, by means of an RIE method, or the like (FIG. 5). Next, by carrying out a thermal oxidation process, a lower portion and a portion at the upper edge of the sidewall external layer spacer of polycrystal silicon are oxidized so that oxide films 11 are formed (FIG. 1). As for this thermal oxidation process, a dry reflow that carries out a thermal treatment in an oxygen gas atmosphere may be used or a wet reflow that carries out a thermal treatment in an H$_2$O atmosphere may be used. In either case, the process is carried out at a temperature of 700° C. to 1200° C.

Important points of the present embodiment are shown in the following:

(a1) Polycrystal silicon film 10 is positioned between gate conductive layer 3 and sidewall external layer spacer 9 and, thereby, stress caused by sidewall external layer spacer 9 made of a nitride film to gate conductive layer 3 can be mitigated.

(a2) The oxide film positioned between silicon substrate 1 and sidewall external layer spacer 9 can be formed by adding oxide film 11 of thermally oxidized polycrystal silicon to conventional oxide film 7. As a result of this, the thickness of the oxide film at the above described position can be made several times thicker than in the prior art and, therefore, stress caused by sidewall external layer spacer 9 made of a nitride film to silicon substrate 1 can be mitigated. The film thickness of the oxide film at the above described position can be appropriately selected by changing the film thickness of polycrystal silicon film 10.

(a3) The thermally oxidized oxide film that is positioned between gate protective film 4 and sidewall external layer spacer 9 can prevent a plug wire formed between the gate wires in a subsequent process and the gate conductive layer from short circuiting.

Second Embodiment

Figure 6:
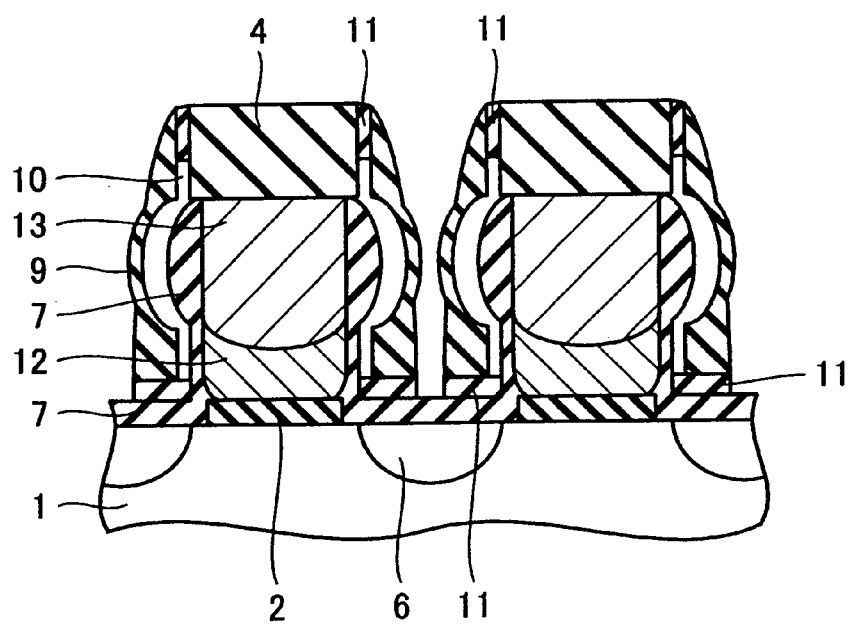
FIG. 6 is a cross sectional view of a semiconductor device according to the second embodiment of the present invention.

In reference to FIG. 6, this gate conductive layer has a two layer structure wherein a lower layer 12 is a polycrystal silicon layer and an upper layer 13 is a silicide film of a high melting point metal, such as of WSi.

Figure 7:
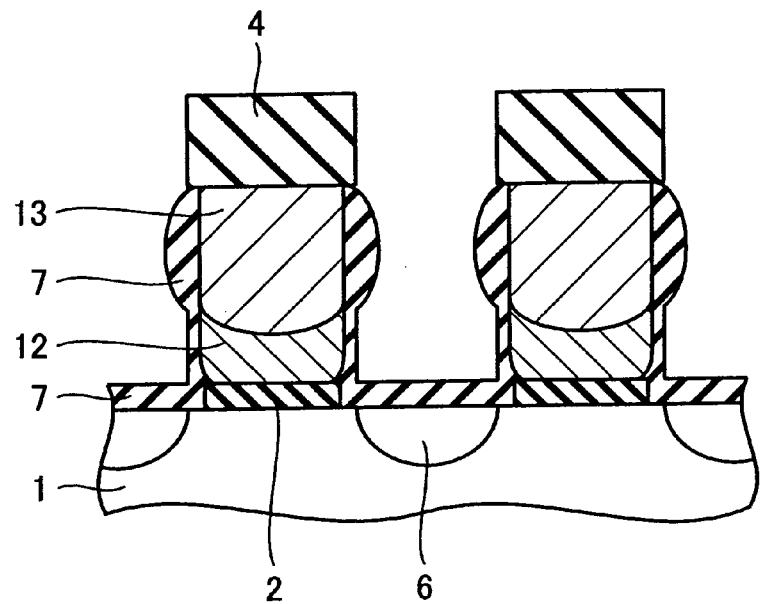
FIG. 7 is a cross sectional view showing the condition wherein thermal oxide films on the sides of metal silicide layers that form gate conductive layers thicken and stick out in the manufacture of the semiconductor device of FIG. 6.

In a thermal oxidation process, the oxidation rate of a silicide film is greater than the oxidation rate of polycrystal silicon. Therefore, as shown in FIG. 7, the film thickness of the oxide film on a sidewall of this silicide film becomes thick in comparison with an oxide film of a sidewall of polycrystal silicon and, thus, sticks out to the outside. The thicker this oxide film is, the smaller becomes the filling in margin at the time when an interlayer insulating film is filled in between the gate conductive layers.

In the case of such a gate wire form, the degree of the above described protrusion of thermal oxide film 7 is reduced and, therefore, the film thickness of thermal oxide film 7 on the silicon substrate cannot be made great. In order to mitigate the above stress it is very effective, in such a case, to carry out the thermal oxidation process under the condition wherein there is no risk of protrusion of the thermal oxide film after the formation of the sidewall external layer spacer so that the film thickness of the oxide film on the silicon substrate is made greater.

Third Embodiment

Figure 8:
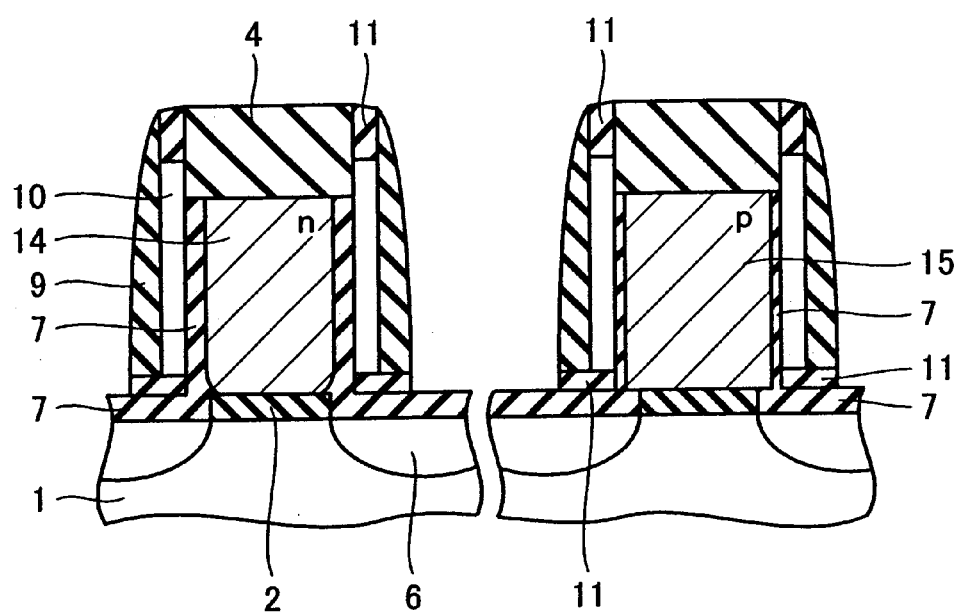
FIG. 8 is a cross sectional view of a semiconductor device according to the third embodiment of the present invention.
Figure 9:
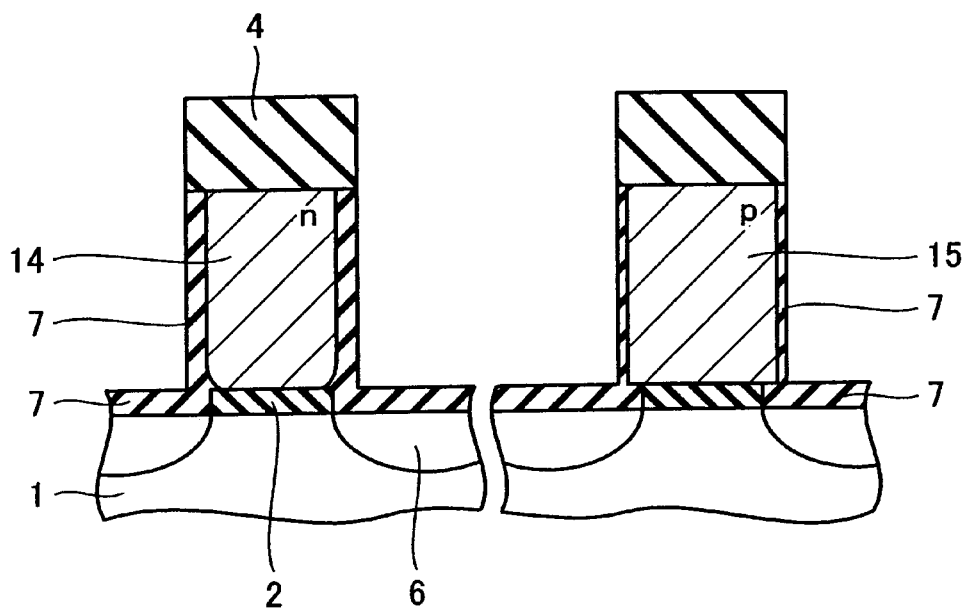
FIG. 9 is a cross sectional view showing the condition wherein thermal oxide films that form sidewalls of gate conductive layers are formed thickly on an n conductive type gate conductive layer and are formed more thinly than as on a p conductive type gate conductive layer at the time of a thermal oxidation process in the manufacture of the semiconductor device of FIG. 8.

In reference to FIG. 8, an n conductive type silicon layer 14 and a p conductive type silicon layer 15 both exist as gate conductive layers in this semiconductor device. P, As, or the like, is doped as an impurity into n conductive type silicon layer 14 and B, or the like, is doped as an impurity into p conductive type silicon layer 15. In general, the oxidation ratio of n conductive type silicon layer 14 is greater than the oxidation ratio of p conductive type silicon layer 15. Therefore, as shown in FIG. 9, the film thickness of thermal oxide film 7 on a sidewall of a gate conductive layer varies depending on the conductive type.

In general, the thicker the film thickness of the oxide films is, the greater the difference of the film thickness of the oxide films on sidewalls of an n conductive type silicon layer and a p conductive type silicon layer becomes so as to negatively influence transistor characteristics. In such a semiconductor device, a thermal oxidation process cannot be sufficiently carried out. According to the present embodiment, a thermal oxidation process can be carried out on polycrystal silicon film 10 under the condition wherein there is no risk of the difference of the film thickness between the oxide films on the sidewalls of an n conductive type silicon layer and a p conductive type silicon layer becoming great after the formation of a sidewall external layer spacer. Therefore, the film thickness of the oxide film of the silicon substrate can be made great so that stress received by the silicon substrate can be reduced, even in the case that a sidewall external layer spacer made of a nitride film is formed.

Fourth Embodiment

Figure 10:
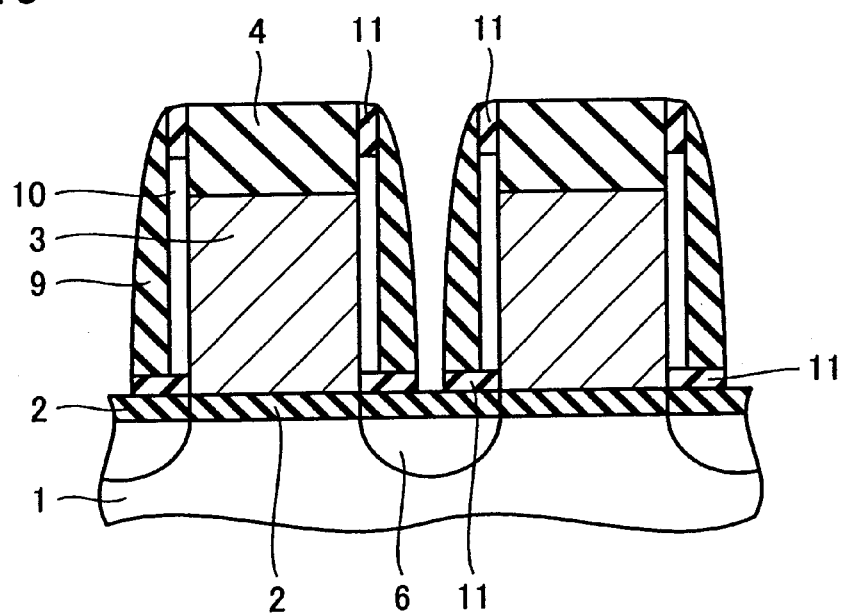
FIG. 10 is a cross sectional view of a semiconductor device having no thermal oxide films on the sides of gate conductive layers according to the fourth embodiment of the present invention.

In reference to FIG. 10, a semiconductor device of the present embodiment is not provided with an oxide film formed by means of a thermal oxidation process on a gate conductive layer or on a surface of a silicon substrate. Other parts of the configuration are the same as of the semiconductor devices of the first to third embodiments. A polycrystal silicon film 10 is formed so as to cover the sidewalls of a gate conductive layer 3 and of a gate protective film, which is thermally oxidized inwardly from the two edge portions by means of a thermal oxidation process after the formation of a sidewall external layer spacer 9.

Next, a manufacturing method for the semiconductor device shown in FIG. 10 is described. First, an element isolation region is formed in a semiconductor substrate by using a filling method, or the like, of a thermal oxide film and an oxide film (see FIG. 11). After that, a silicon oxide film 2 that becomes a gate oxide film is formed and a conductive film 3 that becomes a gate conductive layer, which is a wire, is layered on top of the above. An insulating film 4 that protects the wire is formed on top of the above. Gate oxide film 2 is a non-doped silicon oxide film deposited by using a low pressure CVD (chemical vapor deposition) method or a normal pressure CVD method and the film thickness is 2 nm to 10 nm. Conductive film 3 is made of polycrystal silicon or amorphous silicon deposited by means of a CVD method and P, As or B is doped therein. Or, it is a high melting point metal film, such as of TiN or W, or a silicide film made of these or is a layered film of silicon and of these. The film thickness is 40 nm to 300 nm in all cases. Insulating film 4 is made of an insulating film that has a high etching selection ratio relative to a silicon oxide film at the time when a silicon oxide film is dry etched by means of an RIE (reactive ion etching) method, or the like. A nitride film, a nitride oxide film or a layered film of these deposited by means of a CVD method is conventionally used. A two layer film of an oxide film and a nitride film may be used. The film thickness is 20 nm to 100 nm in all cases.

Next, a photoresist mask of a desired gate wire pattern is applied by means of a photomechanical process. Next, dry etching, primarily of the oxide film, is carried out so as to form insulating film 4 into a desired pattern by means of an RIE method, or the like. Next, dry etching, primarily of the polymetal, is carried out by means of an RIE method, or the like by using patterned insulating film 4 as a mask so as to form a gate wire form. Etching at this time is, in general, carried out under the condition of having a high etching selection ratio relative to a silicon oxide film. Therefore, etching stops in the middle of gate oxide film 2. Next, an impurity, such as P or As, in the order of $10^{13}$ to $10^{14}$ atoms/cm$^2$ is implanted into source/drain regions 6 of a transistor.

Figure 11:
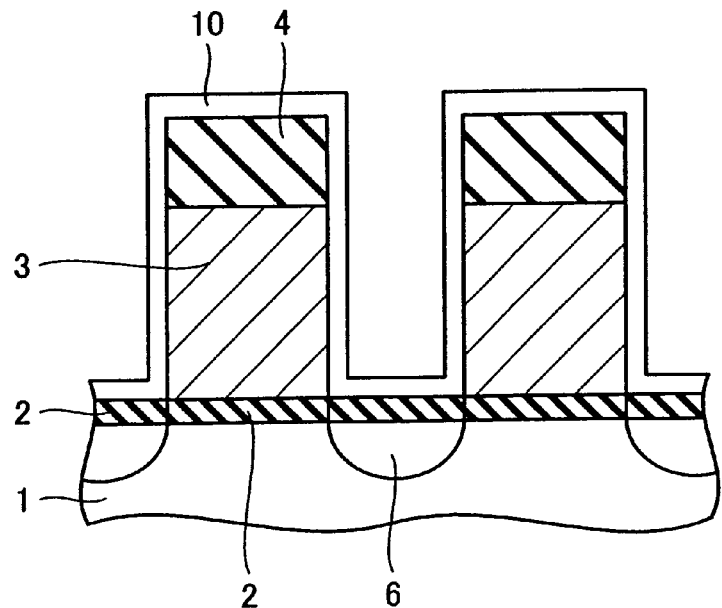
FIG. 11 is a cross sectional view at the stage wherein a polycrystal silicon film is formed so as to directly cover the gate conductive layers and the silicon substrate in the manufacture of the semiconductor device of FIG. 10.

Next, as shown in FIG. 11, polycrystal silicon film or amorphous silicon film 10 is formed so as to cover gate conductive layer 3 and protective insulating layer 4, formed on top of that, by means of a CVD method. This polycrystal silicon film 10 may be doped with P, As or B or may not be doped with an impurity. The film thickness is 5 nm to 20 nm in all cases.

Figure 12:
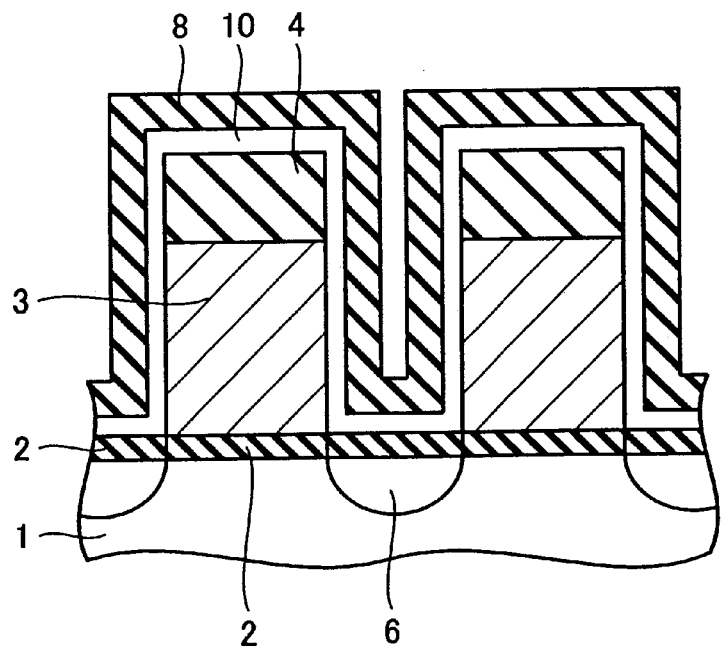
FIG. 12 is a cross sectional view at the stage wherein a protective film is deposited.

Next, an insulating film 8 for the protection of a gate wire is formed (FIG. 12). This insulating film 8 is a film having a sufficiently high etching selection ratio at the time when an oxide film is dry etched by means of an RIE method, or the like. Here, a nitride film or a nitride oxide film deposited by means of a CVD method can be used. The film thickness is 10 nm to 100 nm in all cases.

Figure 13:
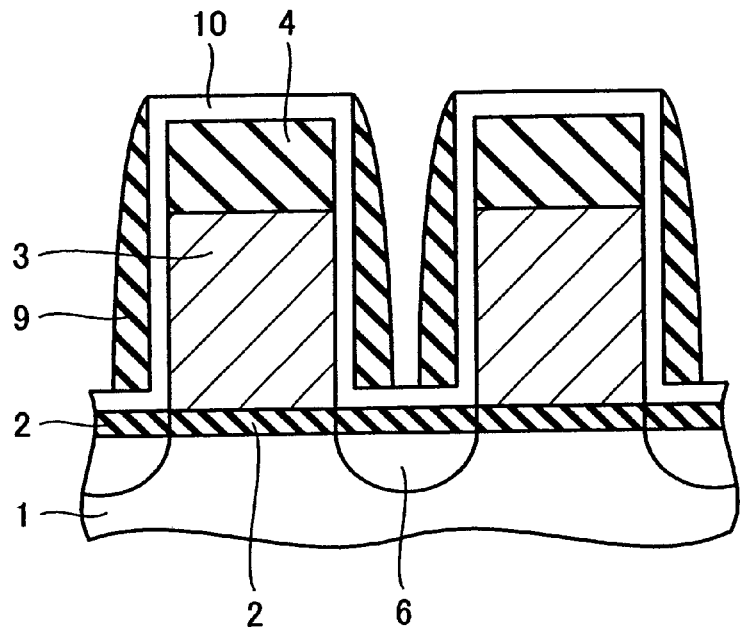
FIG. 13 is a cross sectional view at the stage wherein sidewall external layer spacers are formed through etching.

Next, dry etching, primarily of the oxide film, is carried out on the entire surface by means of an RIE method, or the like, so that a sidewall external layer spacer 9 made of nitride film is formed (FIG. 13). At this time, etching is carried out on portions other than on the sidewall external layer spacers so that a nitride film does not remain on polycrystal silicon film 10.

Figure 14:
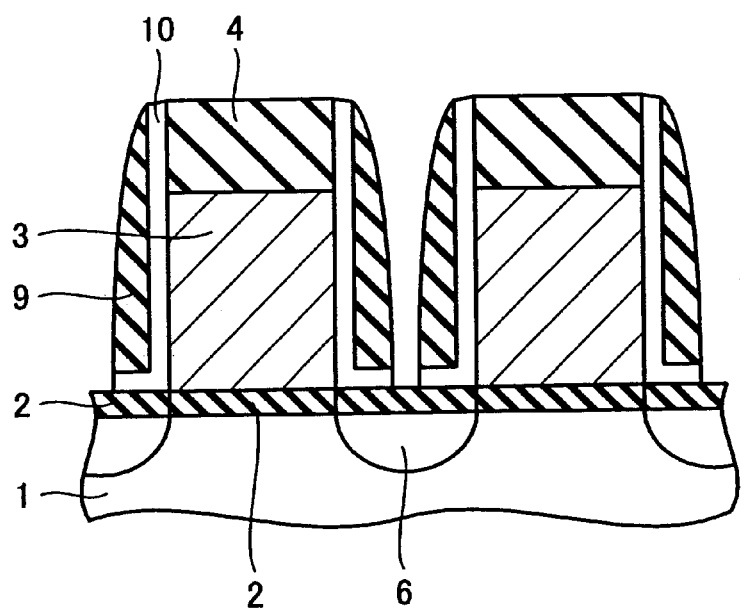
FIG. 14 is a cross sectional view at the stage wherein etching is carried out so as to expose only the edge surface is of polycrystal silicon oxide films.

Next, dry etching, primarily of the polycrystal silicon, is carried out by means of an RIE method, or the like, and, thereby, exposed polycrystal silicon film 10 is removed so as to expose the upper edge and the side edge of the bottom portion of polycrystal silicon film 10 (FIG. 14). Next, the edge portion of the polycrystal silicon film positioned in the lower portion of sidewall external layer spacer 9 made of a nitride film and the edge portion of the polycrystal silicon film in the upper portion of the gate conductive layer are thermally oxidized. By means of this thermal oxidation process, an oxide film 11 is formed inwardly from the above described edge portion so that the semiconductor device shown in FIG. 10 can be gained. As for this thermal oxidation process, a dry reflow that carries out a thermal treatment in an oxygen gas atmosphere may be used or a wet reflow that carries out a thermal treatment in an H$_2$O atmosphere may be used. In either case, the process is carried out at a temperature of 700° C. to 1200° C.

Important points in the present embodiment are as follows:

(d1) When a high melting point metal film, such as of tungsten, is used for a wire in the semiconductor device and, therefore, a thermal oxide film cannot be formed, a sidewall of a gate conductive layer and a surface of the silicon substrate cannot be covered with a thermal oxide film. Therefore, a thermal oxide film positioned between a sidewall external layer spacer made of a nitride film and the silicon substrate is formed of only a thin gate oxide film and a gate oxide layer directly contacts the sidewall external layer spacer. Therefore, the stress caused by the sidewall external layer spacer made of a nitride film is strongly received by the silicon substrate or by the gate conductive layer so that transistor characteristics deteriorate. In such a case, the semiconductor device shown as the present embodiment is used so that a polycrystal silicon film is thermally oxidized after the formation of a sidewall external layer spacer and, thereby, the device gains the function of stress mitigation.

(d2) In addition, a polycrystal silicon film that is not thermally oxidized is placed between a gate conductive layer and a sidewall external layer spacer and, thereby, the stress caused by the sidewall external layer spacer made of a nitride film to the gate conductive layer can be mitigated.

(d3) The film thickness of an oxide film positioned between the silicon substrate and a sidewall external layer spacer made of a nitride film can be made several times thicker than in the prior art. Therefore, the stress caused by the sidewall external layer spacer made of a nitride film to the silicon substrate can be reduced. The film thickness of the oxide film in this position can be easily changed by changing the film thickness of the polycrystal silicon film.

(d4) In addition, a polycrystal silicon film positioned between gate protective insulating layer 4 and a sidewall external layer spacer is thermally oxidized and, thereby, a plug wire that is formed between gate wires in a subsequent process and a gate conductive layer can be prevented from short circuiting.

Fifth Embodiment

Figure 15:
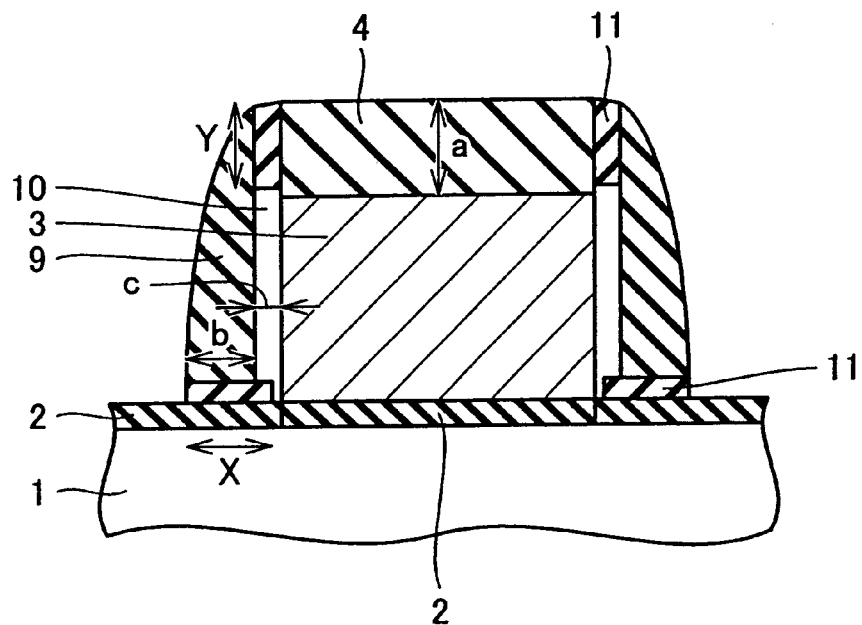
FIG. 15 is a cross sectional view of a semiconductor device for describing the gate electrode structure according to each embodiment of the present invention.

In the embodiments below, the sizes of oxide films 11 of a polycrystal silicon film 10 are specified in the relationships with a gate conductive layer 3, a gate protective insulating layer 4 and a sidewall external layer spacer 9. For this specification of the sizes of oxide films 11 of polycrystal silicon film 10, the depth of the oxidation starting from the side edge of the bottom portion of polycrystal silicon film 10 is denoted as X while the oxidation depth starting from the upper edge is denoted as Y. Though in many cases, X and Y become of the same value, there are some cases wherein they differ from each other. In addition, the thickness of gate protective film 4 is defined as a, the width of the bottom portion of sidewall external layer spacer 9 is defined as b and the film thickness of the polycrystal silicon film is defined as c (FIG. 15).

Figure 16:
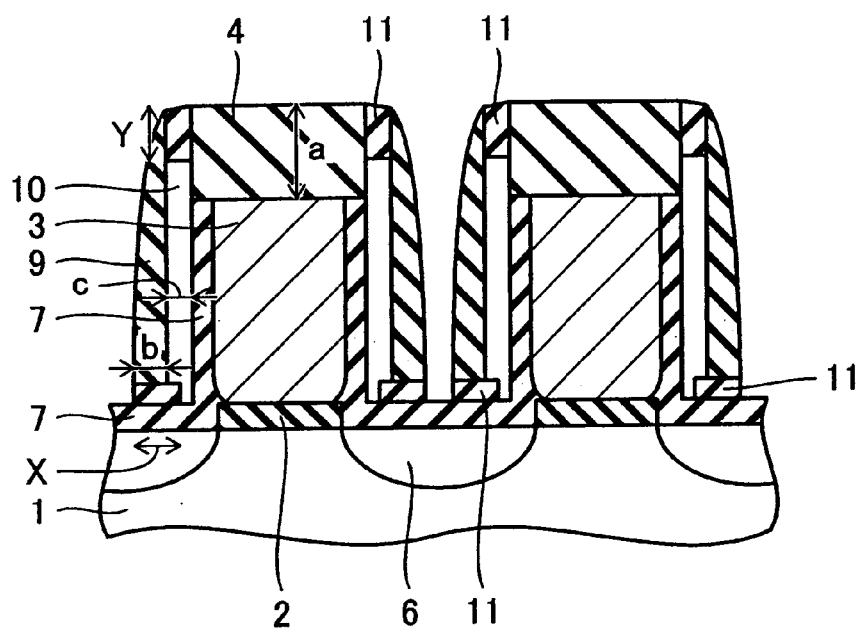
FIGS. 16 to 29 are cross sectional views of semiconductor devices according to the fifth to eighteenth embodiments, respectively, of the present invention.

A semiconductor device according to the fifth embodiment of the present invention corresponds to the case of $b \leq X < b+c$ and $Y < a$, as shown in FIG. 16. That is to say, this is the case wherein the depth (Y) of silicon oxide film 11 starting from the upper edge is shallower than the thickness (a) of gate protective film 4 and the depth (X) of silicon oxide film 11 starting from the side edge of the bottom portion stays within polycrystal silicon film 10.

The semiconductor device according to the present embodiment can be manufactured by using a manufacturing method for a semiconductor device described above. The points concerning the structure of the semiconductor device according to the present embodiment are as follows:

(e1) Polycrystal silicon film 10 is positioned between gate conductive layer 3 and sidewall external layer spacer 9 and, thereby, the stress caused by sidewall external layer spacer 9 made of a nitride film to the gate conductive layer can be mitigated.

(e2) The film thickness of an oxide film positioned between the silicon substrate and a sidewall external layer spacer made of a nitride film can be made several times thicker than in the prior art. Therefore, the stress caused by the sidewall external layer spacer made of a nitride film to the silicon substrate can be reduced. The thickness of the oxide film in this position can easily be changed by changing the film thickness of the polycrystal silicon film.

(e3) The polycrystal silicon film positioned between gate protective insulating layer 4 and a sidewall external layer spacer is thermally oxidized. Therefore, a plug wire formed between gate wires in a subsequent process and a gate conductive layer can be prevented from short circuiting.

Sixth Embodiment

Figure 17:
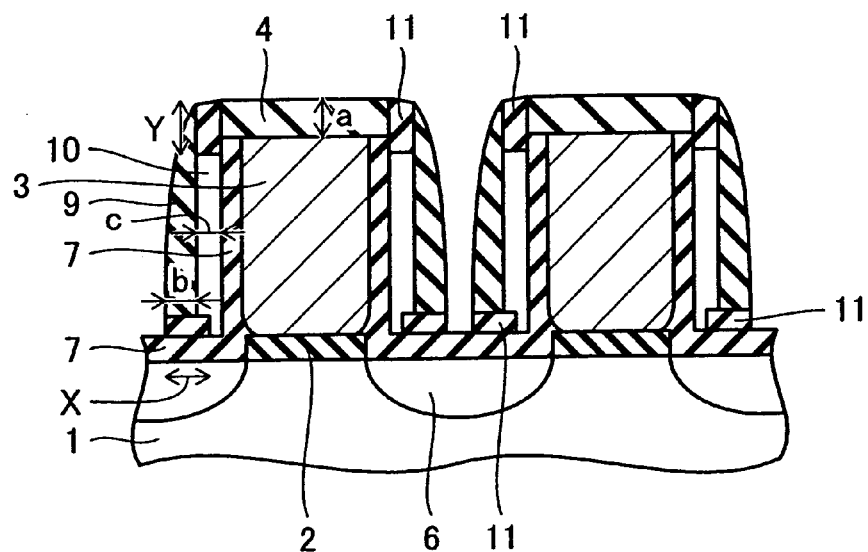

In FIG. 17, a semiconductor device of the present embodiment corresponds to the case of $b \leq X < b+c$ and $Y \geq a$. That is to say, this is the case wherein the depth (Y) of silicon oxide film 11 starting from the upper edge is the same as the thickness (a) of gate protective film 4, or greater than that, while the depth (X) of silicon oxide film 11 starting from the side edge of the bottom portion penetrates sidewall external layer spacer 9 and stays within polycrystal silicon film 10.

The following point is an advantage of the semiconductor device according to the present embodiment.

(f1) Since silicon oxide film 11 from the upper edge is formed deeply, polycrystal silicon film 10 does not have a portion higher than gate conductive layer 3. Therefore, a plug wire formed between gate wires in a subsequent process and a gate wire become resistant to short circuiting. Therefore, the margin for short circuiting can be made greater than in, for example, the prior art and, thereby, the semiconductor device can be miniaturized.

Seventh Embodiment

Figure 18:
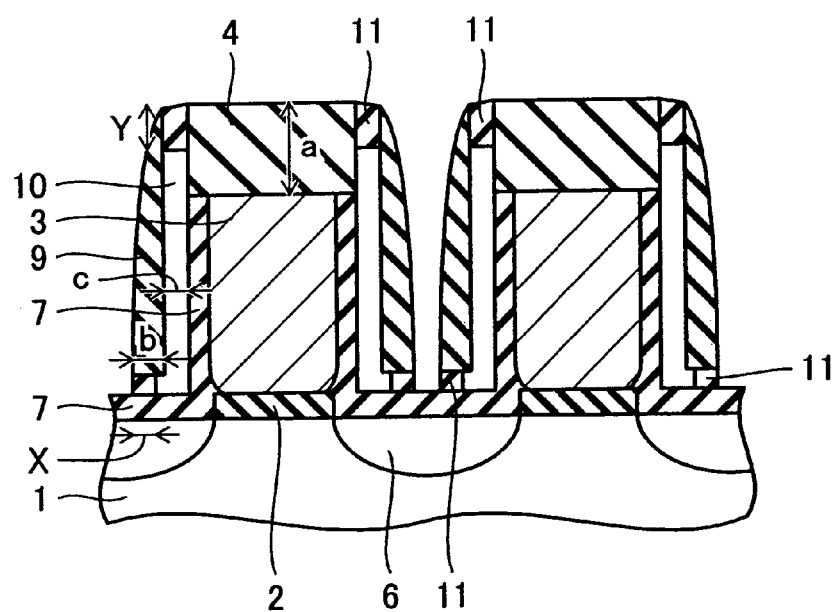

In FIG. 18, a semiconductor device of the present embodiment corresponds to the case of $0 < X < b$ and $Y < a$. That is to say, this is a case wherein the depth (Y) of silicon oxide film 11 from the upper edge is shallower than the thickness (a) of gate protective film 4 while the depth (X) of silicon oxide film 11 from the side edge of the bottom portion stays within the width (b) of a sidewall external layer spacer.

The following point is an advantage of the semiconductor device according to the present embodiment.

(g1) The entirety of polycrystal silicon film 10 in the range positioned beneath a sidewall external layer spacer is not oxidized so that a portion of a polycrystal silicon film remains. Therefore, the stress caused by the sidewall external layer spacer made of a nitride film can be further mitigated.

Eighth Embodiment

Figure 19:
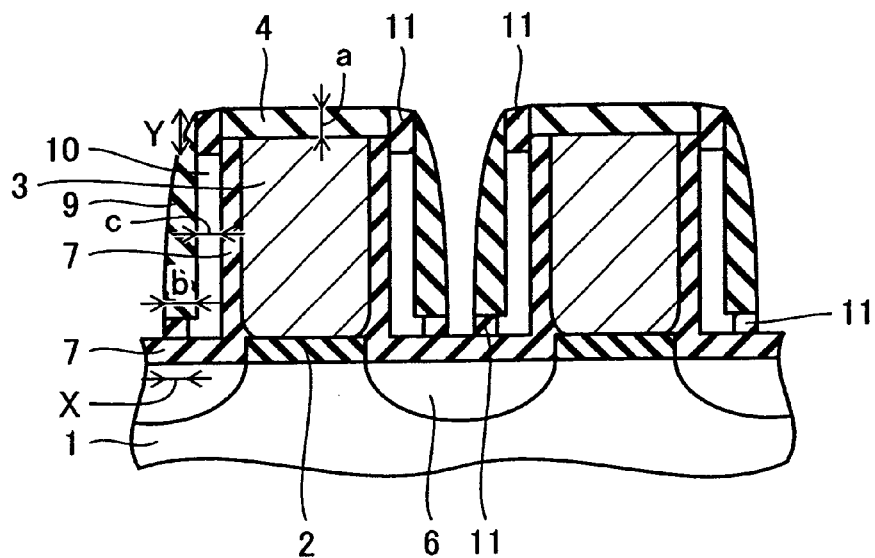

In FIG. 19, a semiconductor device of the present embodiment corresponds to the case of $0 < X < b$ and $Y \geq a$. That is to say, this is the case wherein the depth (Y) of silicon oxide film 11 from the upper edge is the same as the thickness (a) of gate protective film 4, or deeper than that, while the depth (X) of silicon oxide film 11 from the side edge of the bottom portion stays within the width (b) of a sidewall external layer spacer.

The following point is an advantage of the semiconductor device according to the present embodiment:

(h1) In comparison with the semiconductor device of the fifth embodiment, silicon oxide film 11 from the upper edge is formed deeply and, therefore, polycrystal silicon film 10 does not have a portion higher than gate conductive layer 3. Therefore, a plug wire formed between gate wires in a subsequent step and a gate wire become resistant to short circuiting. Therefore, the margin for short circuiting can be made greater than in, for example, the prior art and, thereby, the semiconductor device can be miniaturized.

Ninth Embodiment

Figure 20:
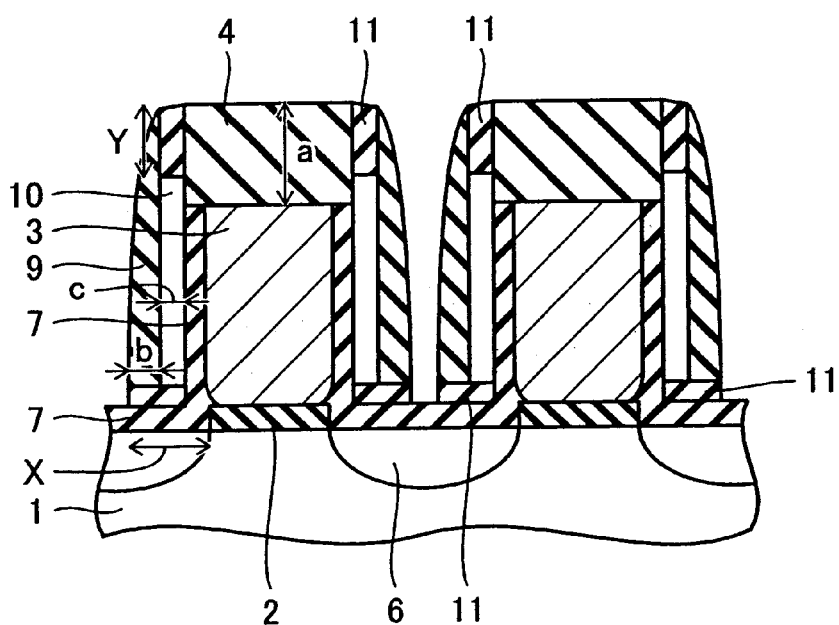

In FIG. 20, a semiconductor device of the present embodiment corresponds to the case of $b+c \leq X < b+2c$ and $Y < a$. That is to say, this is the case wherein the depth (Y) of silicon oxide film 11 from the upper edge is shallower than the thickness (a) of gate protective film 4 while the depth (x) of silicon oxide film 11 from the side edge of the bottom portion penetrates polycrystal silicon film 10 and reaches to a sidewall internal layer oxide film (lower layer oxide film) 7 and, in addition, to a gate conductive layer.

The following point is an advantage of the semiconductor device according to the present embodiment:

(i1) In comparison with the semiconductor device according to the fifth embodiment, the rounded portion of a rounded oxide layer that sticks out into a gate conductive layer from a bottom portion of sidewall internal layer oxide film (lower layer oxide film) 7 can be made to bulge further. This is because silicon oxide film 11 from the side edge of a bottom portion reaches to sidewall internal layer oxide film (lower layer oxide film) 7 and, thereby, oxygen, or the like, is supplied to sidewall internal layer oxide film (lower layer oxide film) 7. By increasing a rounded portion as described above, it becomes possible to more surely prevent the occurrence of hot carriers due to the concentration of the electrical field at a gate edge portion.

Tenth Embodiment

Figure 21:
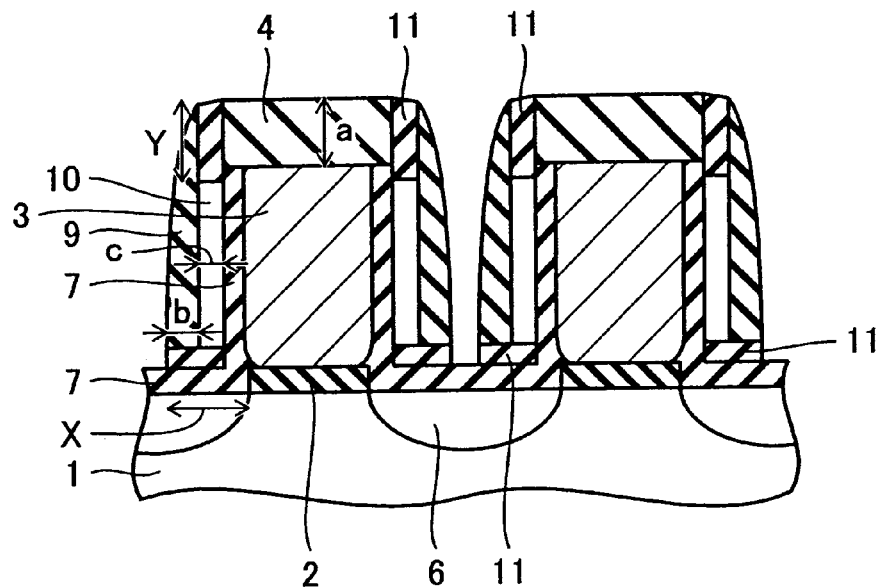

In FIG. 21, a semiconductor device of the present embodiment corresponds to the case of b+c≦X<b+2c and Y≧a. That is to say, this is the case wherein the depth (Y) of silicon oxide film 11 from the upper edge is the same as the thickness (a) of gate protective film 4, or deeper than that, while the depth (X) of silicon oxide film 11 from the side edge of the bottom portion penetrates polycrystal silicon film 10 and reaches to a sidewall internal layer oxide film (lower layer oxide film) 7 and, in addition, to a gate conductive layer.

The following point is an advantage of the semiconductor device according to the present embodiment:

(j1) In comparison with the semiconductor device of the fifth embodiment, silicon oxide film 11 from the upper edge is formed deeply and, therefore, polycrystal silicon film 10 does not have a portion higher than gate conductive layer 3. Therefore, a plug wire formed between gate wires in a subsequent step and a gate wire become resistant to short circuiting. Therefore, the margin for short circuiting can be made greater than in, for example, the prior art and, thereby, the semiconductor device can be miniaturized.

(j2) In comparison with the semiconductor device according to the fifth embodiment, the rounded portion of a rounded oxide layer that sticks out into a gate conductive layer from a bottom portion of sidewall internal layer oxide film (lower layer oxide film) 7 can be made to bulge further. This is because silicon oxide film 11 from the side edge of a bottom portion reaches to sidewall internal layer oxide film (lower layer oxide film) 7 and, thereby, oxygen, or the like, is supplied to sidewall internal layer oxide film (lower layer oxide film) 7. By increasing a rounded portion as described above, it becomes possible to more surely prevent the occurrence of hot carriers due to the concentration of the electrical field at a gate edge portion.

Eleventh Embodiment

Figure 22:
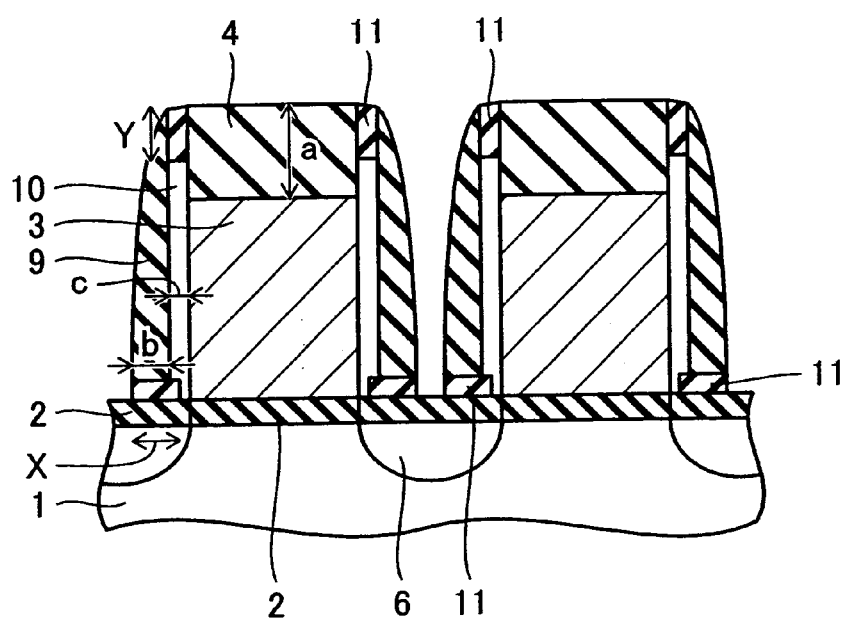

In FIG. 22, a semiconductor device of the present embodiment corresponds to the case of b≦X<b+c and Y<a. That is to say, this is the case wherein the depth (Y) of silicon oxide film 11 starting from the upper edge is shallower than the thickness (a) of gate protective film 4 while the depth (X) of silicon oxide film 11 starting from the side edge of the bottom portion penetrates sidewall external layer spacer 9 and stays within polycrystal silicon film 10.

The following point is an advantage of the semiconductor device according to the present embodiment:

(k1) When a high melting point metal film is used as a material for a gate conductive layer, thermal oxide film 7 as shown in the first embodiment is, in many cases, avoided to be formed. In such a case, a sidewall of a gate conductive layer and a surface of the silicon substrate cannot be covered with a thermal oxide film. Therefore, in a conventional semiconductor device, an oxide film positioned between a sidewall external layer spacer made of a nitride film and the silicon substrate is formed of a gate oxide film, or the like, so as to become thin. Furthermore, in the conventional semiconductor device, the gate conductive layer directly contacts the sidewall external layer spacer made of a nitride film. As a result of this, in the conventional semiconductor device, the stress received by the gate conductive layer and by the silicon substrate becomes great.

In the semiconductor device according to the present embodiment, as shown in FIG. 22, polycrystal silicon film 10 intervenes between sidewall external layer spacer 9 of a nitride film and gate conductive layer 3. In addition, oxide film 11 gained by thermally oxidizing a polycrystal silicon film intervenes between sidewall external layer spacer 9 of a nitride film and silicon substrate 1. Therefore, the stress caused by sidewall external layer spacer 9 made of a nitride film to gate conductive layer 3 and silicon substrate 1 can be greatly reduced.

(k2) In particular, the film thickness of an oxide film positioned between the silicon substrate and a sidewall external layer spacer made of a nitride film can be made several times thicker than in the prior art. Therefore, the stress caused by the sidewall external layer spacer made of a nitride film to the silicon substrate can be reduced. The thickness of the oxide film in this position can easily be changed by changing the film thickness of the polycrystal silicon film.

(k3) Silicon oxide film 11 from the upper edge is formed deeply and, therefore, polycrystal silicon film 10 does not have a portion higher than gate conductive layer 3. Therefore, a plug wire formed between gate wires in a subsequent step and a gate wire become resistant to short circuiting. Therefore, the margin for short circuiting can be made greater than in, for example, the prior art and, thereby, the semiconductor device can be miniaturized.

Twelfth Embodiment

Figure 23:
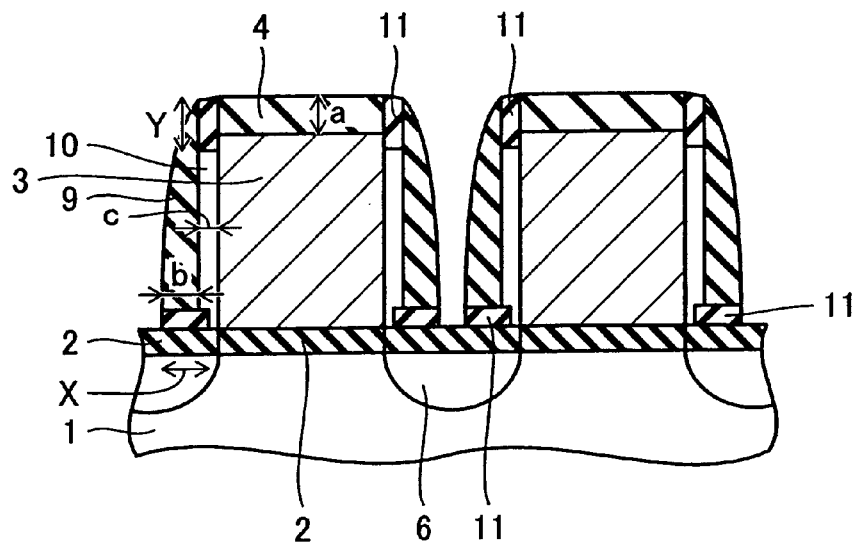

In FIG. 23, a semiconductor device of the present embodiment corresponds to the case of b≦X<b+c and Y≧a. That is to say, this is the case wherein the depth (Y) of silicon oxide film 11 starting from the upper edge is the same as the thickness (a) of gate protective film 4, or deeper than that, while the depth (X) of silicon oxide film 11 starting from the side edge of the bottom portion penetrates sidewall external layer spacer 9 and stays within polycrystal silicon film 10.

The following point is an advantage of the semiconductor device according to the present embodiment:

(l1) In comparison with the semiconductor device according to the eleventh embodiment, silicon oxide film 11 from the upper edge is formed deeply and, therefore, polycrystal silicon film 10 does not have a portion higher than gate conductive layer 3. Therefore, a plug wire formed between gate wires in a subsequent step and a gate wire become resistant to short circuiting. Therefore, the margin for short circuiting can be made greater than in, for example, the prior art and, thereby, the semiconductor device can be miniaturized.

Thirteenth Embodiment

Figure 24:
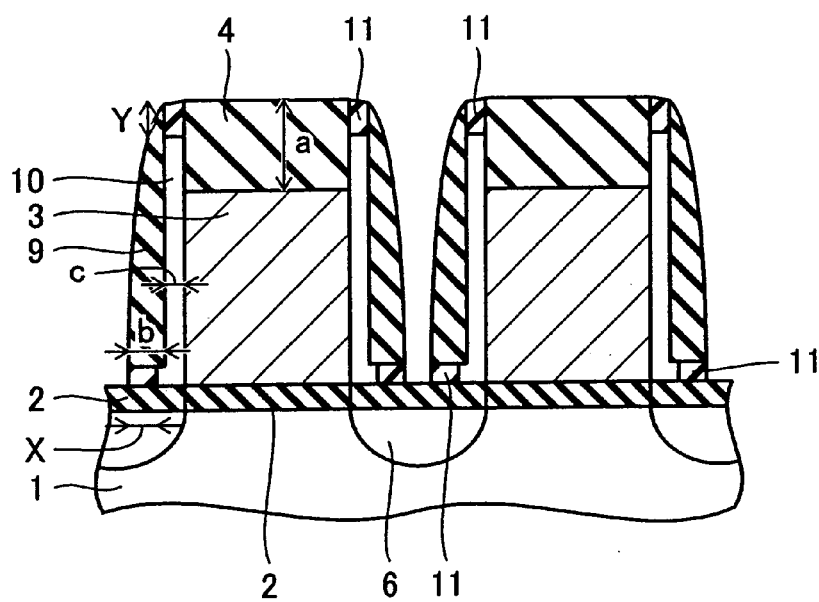

In FIG. 24, a semiconductor device of the present embodiment corresponds to the case of 0<X<b and Y<a. That is to say, this is the case wherein the depth (Y) of silicon oxide film 11 from the upper edge is shallower than the thickness (a) of gate protective film 4 while the depth (X) of silicon oxide film 11 from the side edge of the bottom portion stays within sidewall external layer spacer 9.

The following point is an advantage of the semiconductor device according to the present embodiment.

(m1) In comparison with the semiconductor device of the eleventh embodiment, the entirety of polycrystal silicon film 10 in the range positioned beneath a sidewall external layer spacer is not oxidized so that a portion of a polycrystal silicon film remains. Therefore, the stress caused by the sidewall external layer spacer made of a nitride film can be further mitigated.

Fourteenth Embodiment

Figure 25:
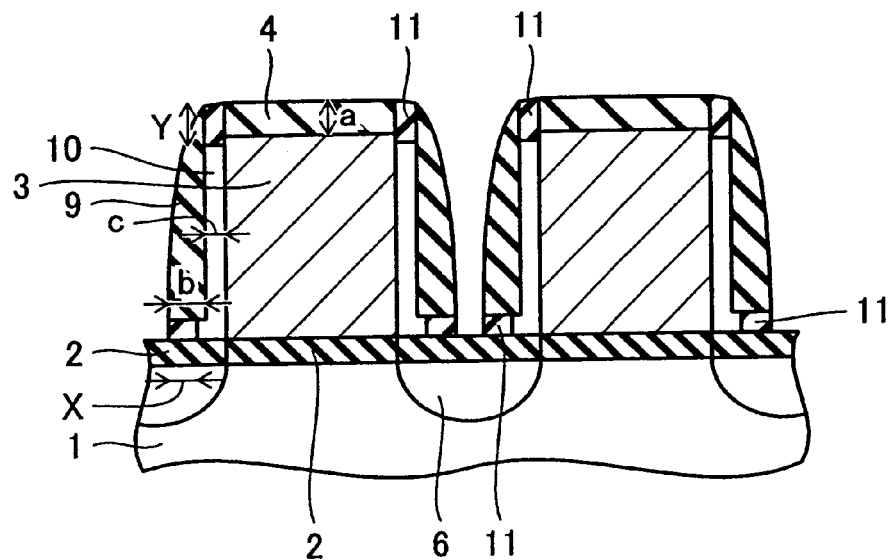

In FIG. 25, a semiconductor device of the present embodiment corresponds to the case of 0<X<b and Y≧a. That is to say, this is the case wherein the depth (Y) of silicon oxide film 11 from the upper edge is the same as the thickness (a) of gate protective film 4, or deeper than that, while the depth (X) of silicon oxide film 11 from the side edge of the bottom portion stays within sidewall external layer spacer 9.

The following point is an advantage of the semiconductor device according to the present embodiment:

(n1) In comparison with the semiconductor device of the eleventh embodiment, silicon oxide film 11 from the upper edge is formed deeply and, therefore, polycrystal silicon film 10 does not have a portion higher than gate conductive layer 3. Therefore, a plug wire formed between gate wires in a subsequent step and a gate wire become resistant to short circuiting. Therefore, the margin for short circuiting can be made greater than in, for example, the prior art and, thereby, the semiconductor device can be miniaturized.

(n2) In comparison with the semiconductor device of the eleventh embodiment, the entirety of polycrystal silicon film 10 in the range positioned beneath a sidewall external layer spacer is not oxidized so that a portion of a polycrystal silicon film remains. Therefore, the stress caused by the sidewall external layer spacer made of a nitride film can be further mitigated.

Fifteenth Embodiment

Figure 26:
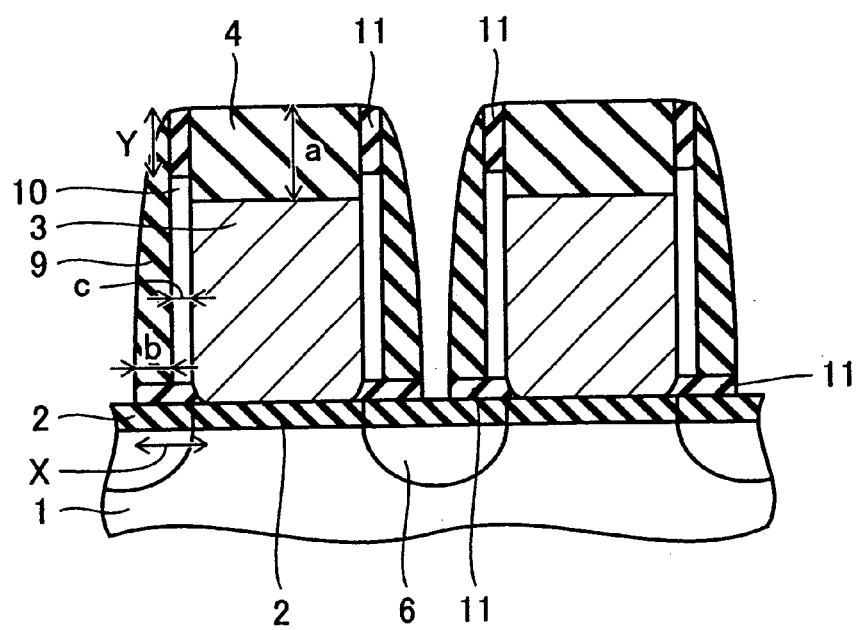

In FIG. 26, a semiconductor device of the present embodiment corresponds to the case of b+c≦X<b+2c and Y<a. That is to say, this is the case wherein the depth (Y) of silicon oxide film 11 starting from the upper edge is shallower than the thickness (a) of gate protective film 4 while the depth (X) of silicon oxide film 11 starting from the side edge of the bottom portion penetrates sidewall external layer spacer 9 and polycrystal silicon film 10 and stays within the gate conductive layer.

The following point is an advantage of the semiconductor device according to the present embodiment:

(o1) In comparison with the semiconductor device of the eleventh embodiment, the rounded portion of a rounded oxide layer that sticks out into a gate conductive layer from a bottom portion of sidewall internal layer oxide film (lower layer oxide film) 7 can be made to bulge further. This is because silicon oxide film 11 from the side edge of a bottom portion reaches to sidewall internal layer oxide film (lower layer oxide film) 7 and, thereby, oxygen, or the like, is supplied to sidewall internal layer oxide film 7. By increasing a rounded portion as described above, it becomes possible to more surely prevent the occurrence of hot carriers due to the concentration of the electrical field at a gate edge portion.

Sixteenth Embodiment

Figure 27:
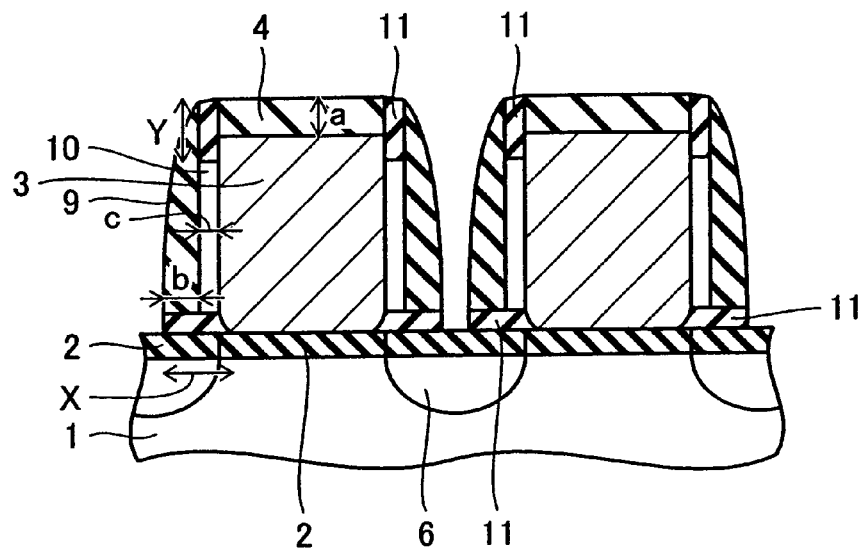

In FIG. 27, a semiconductor device of the present embodiment corresponds to the case of b+c≦X<b+2c and Y≧a. That is to say, this is the case wherein the depth (Y) of silicon oxide film 11 starting from the upper edge is the same as the thickness (a) of gate protective film 4, or deeper than that, while the depth (X) of silicon oxide film 11 starting from the side edge of the bottom portion penetrates sidewall external layer spacer 9 and polycrystal silicon film 10 and stays within the gate conductive layer.

The following point is an advantage of the semiconductor device according to the present embodiment:

(p1) In comparison with the semiconductor device of the eleventh embodiment, silicon oxide film 11 from the upper edge is formed deeply and, therefore, polycrystal silicon film 10 does not have a portion higher than gate conductive layer 3. Therefore, a plug wire formed between gate wires in a subsequent step and a gate wire become resistant to short circuiting. Therefore, the margin for short circuiting can be made greater than in, for example, the prior art and, thereby, the semiconductor device can be miniaturized.

(p2) In comparison with the semiconductor device of the eleventh embodiment, the rounded portion of a rounded oxide layer that sticks out into a gate conductive layer from a bottom portion of sidewall internal layer oxide film 7 can be made to bulge further. This is because silicon oxide film 11 from the side edge of a bottom portion reaches to sidewall internal layer oxide film 7 and, thereby, oxygen, or the like, is supplied to sidewall internal layer oxide film 7. By increasing a rounded portion as described above, it becomes possible to more surely prevent the occurrence of hot carriers due to the concentration of the electrical field at a gate edge portion.

Seventeenth Embodiment

Figure 28:
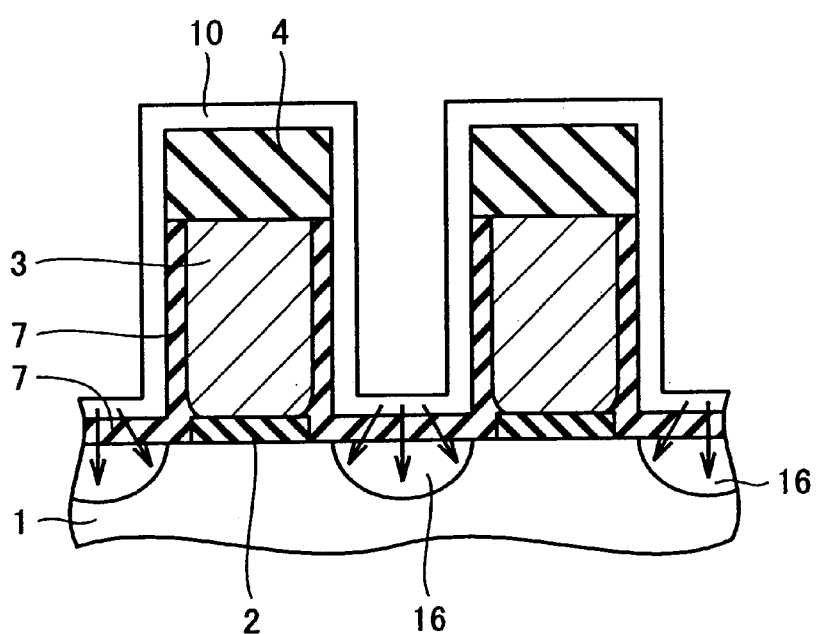

The subject of the present embodiment is a semiconductor device having a structure wherein a thermal oxide film 7 is formed on a side of a gate conductive layer and a polycrystal silicon film 10 is deposited outside thereof (FIG. 28).

According to the present embodiment, a manufacturing method wherein the step of implanting an impurity into source/drain regions of the silicon substrate by means of an ion implantation method, or the like, is omitted is described in respect to the subject of the above described semiconductor device. At the time when polycrystal silicon film 10, shown in FIG. 2, is deposited, a polycrystal silicon film doped with P, As or B is deposited. After this, as shown in FIG. 28, a thermal treatment is carried out in a nitrogen atmosphere so as to diffuse, in the solid state, the above described impurity into the silicon substrate and, thereby, source/drain regions 6 are formed. The concentration of P, As, B, or the like, and the temperature and the period of time of the thermal treatment are adjusted so that the desired source/drain regions can be gained.

The following point is an advantage of the semiconductor device according to the present embodiment:

(q1) In the case that source/drain regions are formed by means of an ion implantation method in a manufacturing method according to the prior art, the impurity spreads so that the impurity is introduced beneath gate conductive layer 3. Therefore, the punch through margin of a transistor is lost. According to the manufacturing method in the present embodiment, the deposition of polycrystal silicon film 10 doped with an impurity and a thermal treatment are combined at the time of manufacture of a semiconductor device of the first to third embodiments and, thereby, source/drain regions can be formed through solid state diffusion. As a result of this, improvement of transistor characteristics can be achieved by restricting the spread of the impurity beneath the gate conductive layer.

Eighteenth Embodiment

Figure 29:
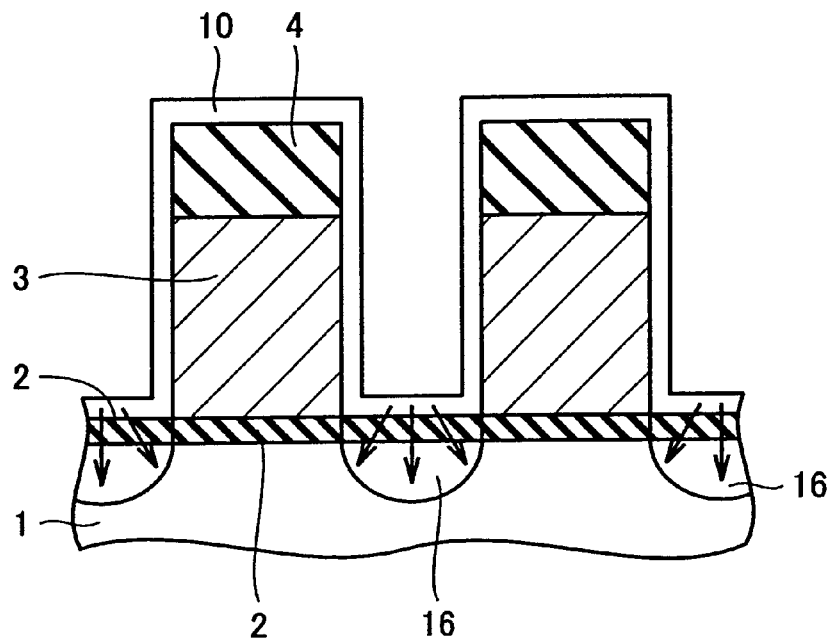

The subject of the present embodiment is a semiconductor device having a structure wherein a polycrystal silicon film 10 is directly deposited on a side of a gate conductive layer (FIG. 29). Accordingly, it is desirable for a manufacturing method of the present embodiment to be used in the case of a gate conductive layer including a high melting point metal layer.

According to the present embodiment, a manufacturing method wherein the step of implanting an impurity into source/drain regions of the silicon substrate by means of an ion implantation method, or the like, is omitted is described in respect to the subject of the above described semiconductor device. At the time when polycrystal silicon film 10, shown in FIG. 11, is deposited, a polycrystal silicon film doped with P, As or B is deposited. After this, as shown in FIG. 29, a thermal treatment is carried out in a nitrogen atmosphere so as to diffuse, in the solid state, the above described impurity into the silicon substrate and, thereby, source/drain regions 6 are formed. The concentration of P, As, B, or the like, and the temperature and the period of time of the thermal treatment are adjusted so that the desired source/drain regions can be gained.

An advantage of the manufacturing method according to the present embodiment is the same as the advantage described in the seventeenth embodiment.

Nineteenth Embodiment

FIGS. 30 to 33 are cross sectional views for describing a manufacturing method for a semiconductor device according to the nineteenth embodiment of the present invention. The subject of the present embodiment is a semiconductor device having a structure wherein a thermal oxide film 7 is formed on a side of a gate conductive layer and a polycrystal silicon film 10 is deposited outside thereof.

Figure 30:
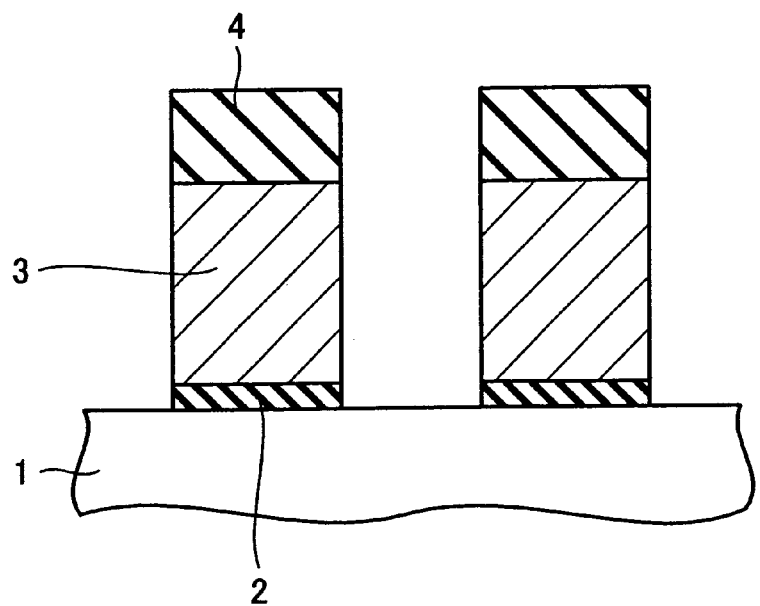
FIG. 30 is a cross sectional view at the stage wherein a gate conductive layer and a gate oxide film are patterned in the manufacture of a semiconductor device according to the nineteenth embodiment of the present invention.
Figure 31:
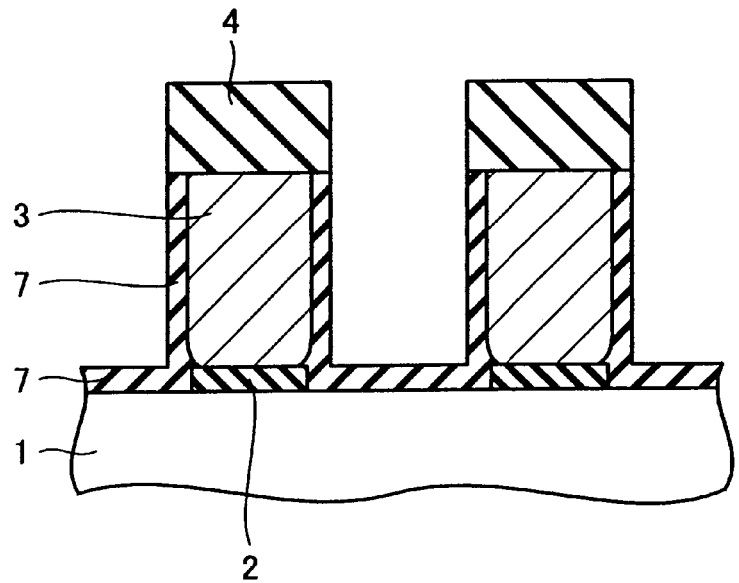
FIG. 31 is a cross sectional view at the stage wherein a thermal oxidation process is carried out while omitting an ion implantation step.

In the present embodiment, in order to manufacture the above described semiconductor device, first, as shown in FIG. 30, patterning is carried out up to gate oxide film 2 so as to expose silicon substrate 1 at the time when gate conductive layer 3 is patterned. Next, though conventionally an impurity is introduced into source/drain regions by means of an ion implantation method, this ion implantation process is omitted in the manufacturing method of the present embodiment. After the patterning step shown in FIG. 30, a thermal oxidation process, shown in FIG. 31, is carried out. According to this thermal oxidation process, a thermal oxide film 7 is formed on a sidewall of gate conductive layer 3 and on the surface layer of silicon substrate 1.

Figure 32:
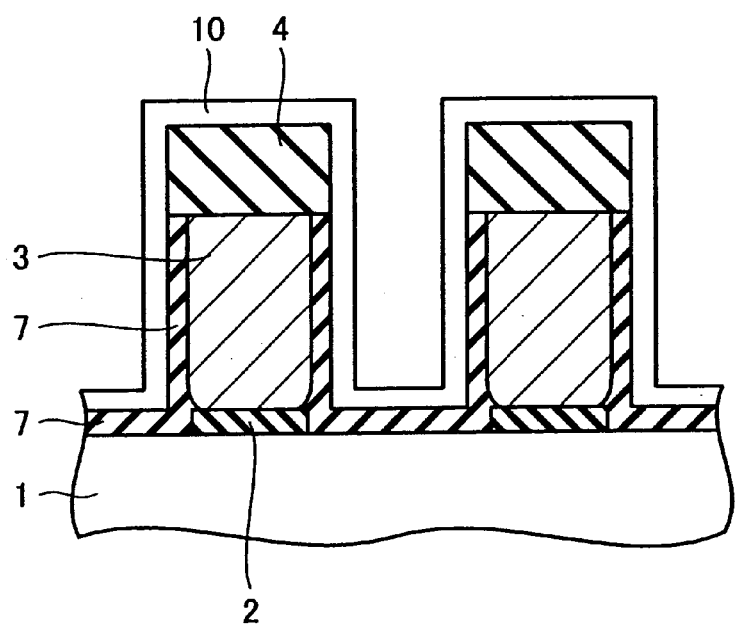
FIG. 32 is a cross sectional view at the stage wherein a polycrystal silicon film doped with an impurity is deposited.
Figure 33:
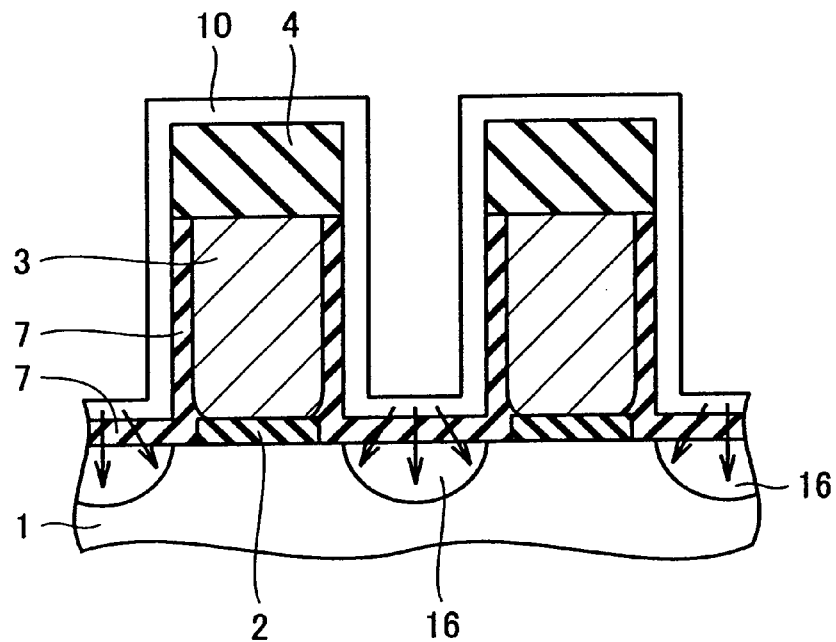
FIG. 33 is a cross sectional view at the stage wherein the impurity is introduced into source/drain regions by diffusing, in the solid state, the impurity from the polycrystal silicon film doped with the impurity.

Next, as shown in FIG. 32, polycrystal silicon film 10 doped with P, As, B, or the like, is deposited at the time of deposition of polycrystal silicon film 10. Next, as shown in FIG. 33, a thermal treatment is carried out in a nitrogen atmosphere so that the above described impurity is diffused, in the solid state, into the silicon substrate so as to form source/drain regions 6. The concentration of the above described impurity and the temperature, the period of time, and the like, of the thermal treatment can be adjusted so that the desired source/drain regions are gained.

An advantage of the present embodiment is the same as the advantage described in the seventeenth embodiment.

Twentieth Embodiment

Figure 34:
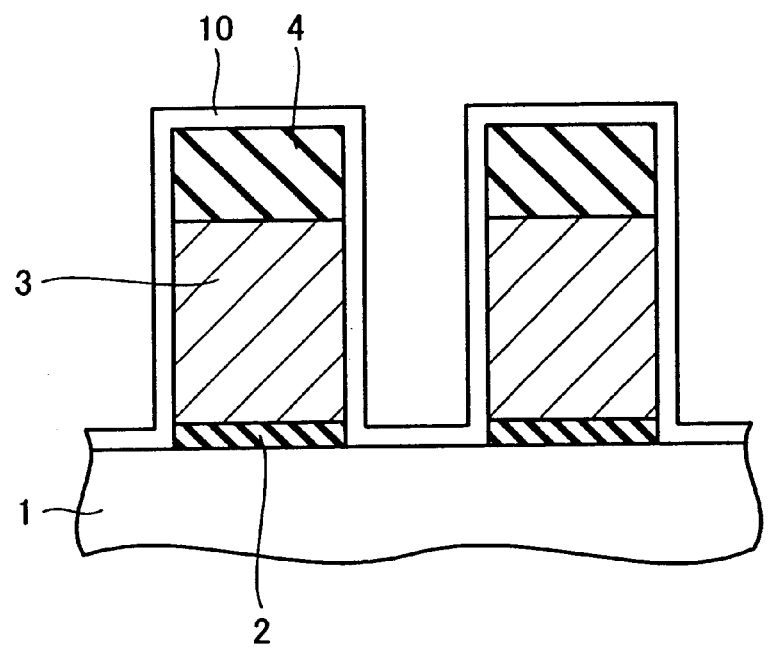
FIG. 34 is a cross sectional view at the stage wherein a polycrystal silicon film doped with an impurity is formed so as to directly contact gate conductive layers and the silicon substrate while omitting thermal oxidation process steps in the manufacture of a semiconductor device according to the twentieth embodiment of the present invention.
Figure 35:
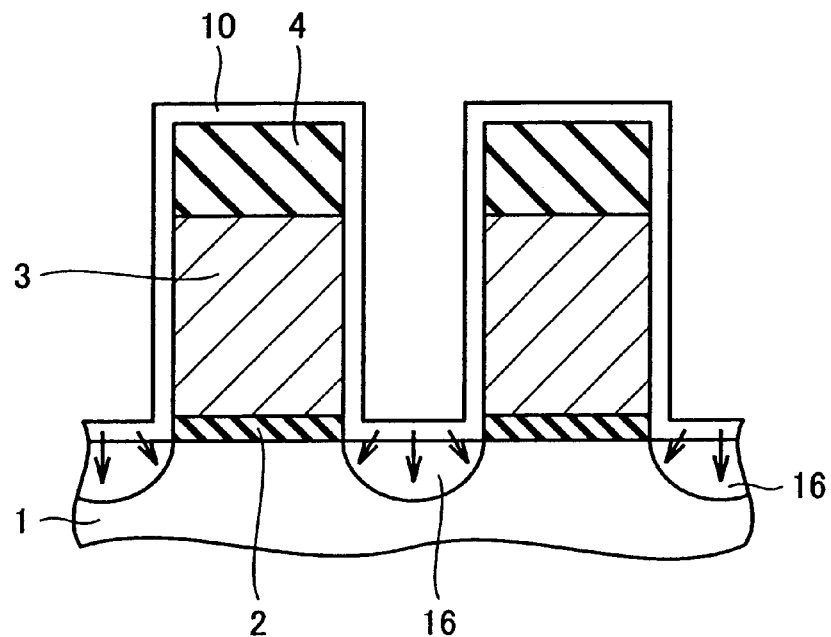
FIG. 35 is a cross sectional view at the stage wherein the impurity is introduced into source/drain regions by diffusing, in the solid state, impurity from the polycrystal silicon film doped with the impurity.
Figure 36:
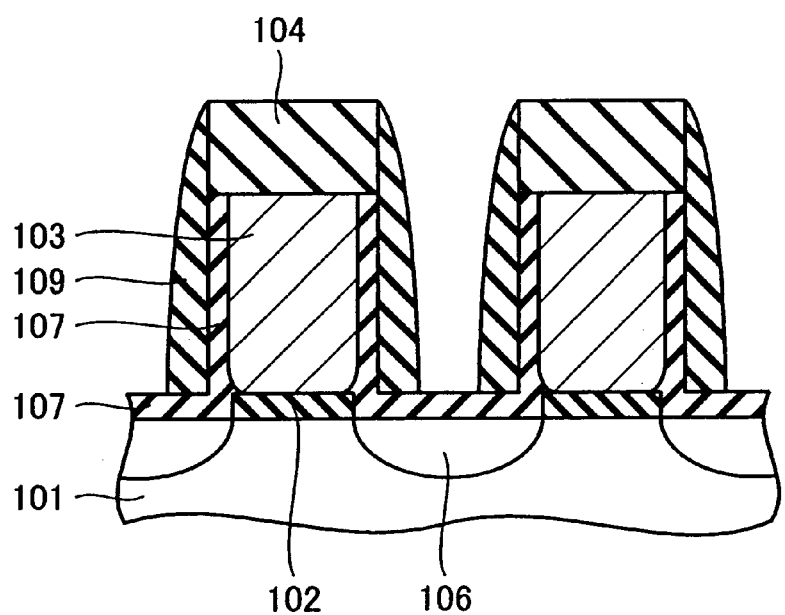
FIG. 36 is a cross sectional view showing transistors of a DRAM according to a prior art.
Figure 37:
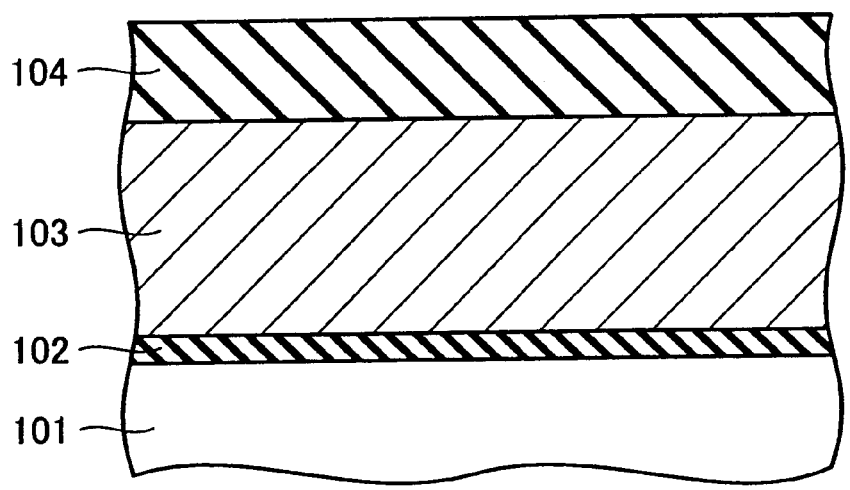
FIG. 37 is a cross sectional view at the stage wherein a gate protective film is formed on a conductive film in the manufacture of the transistors of FIG. 36.
Figure 38:
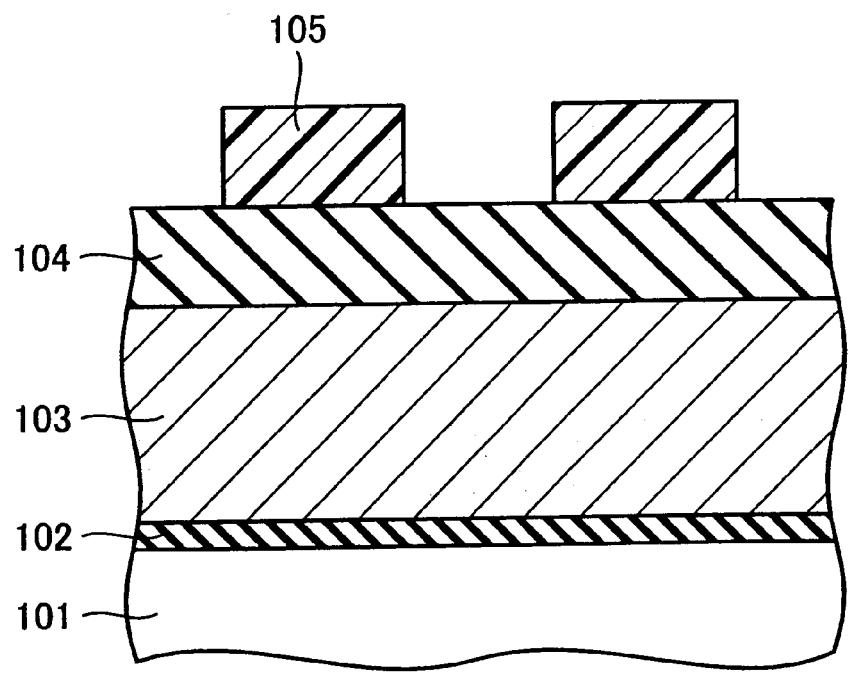
FIG. 38 is a cross sectional view at the stage wherein a photoresist mask is applied onto the gate protective film.
Figure 39:
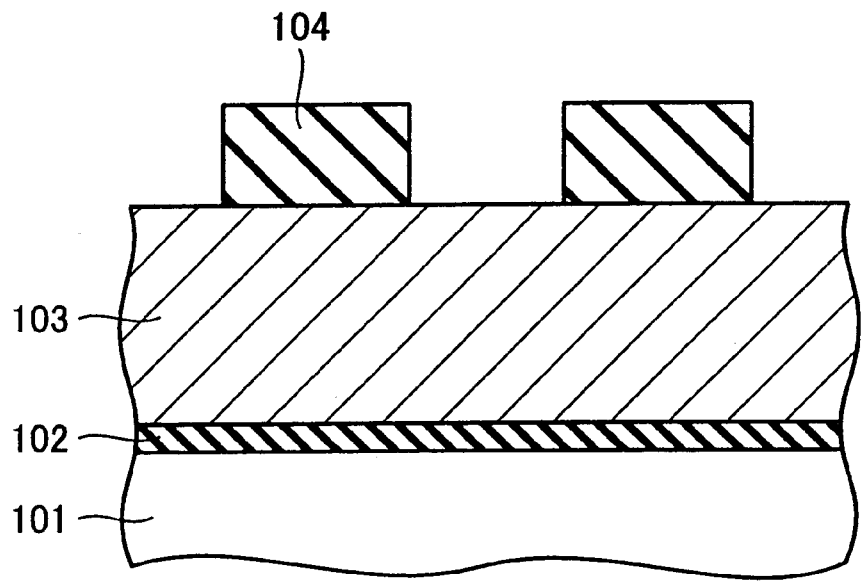
FIG. 39 is a cross sectional view at the stage wherein the gate protective film is patterned.
Figure 40:
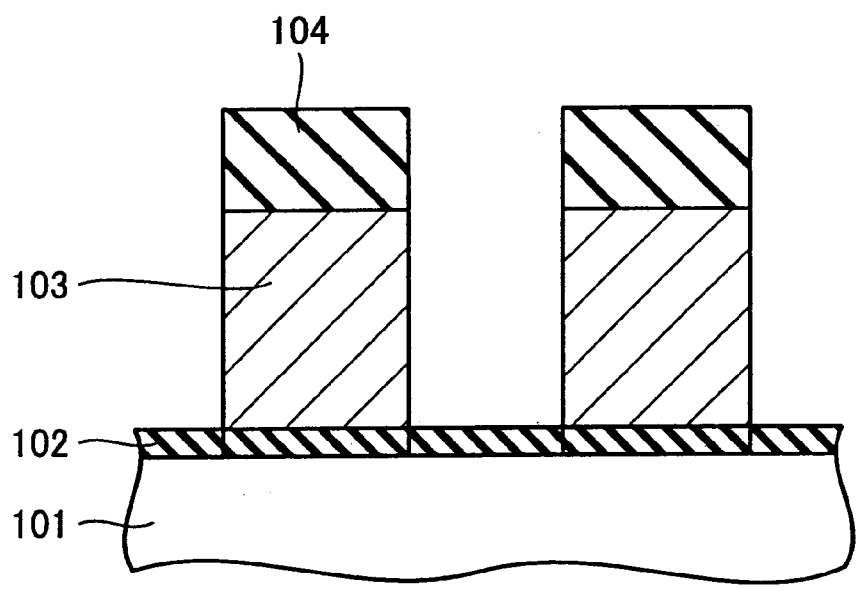
FIG. 40 is a cross sectional view at the stage wherein the gate conductive layer is patterned by using the gate protective film as a mask.
Figure 41:
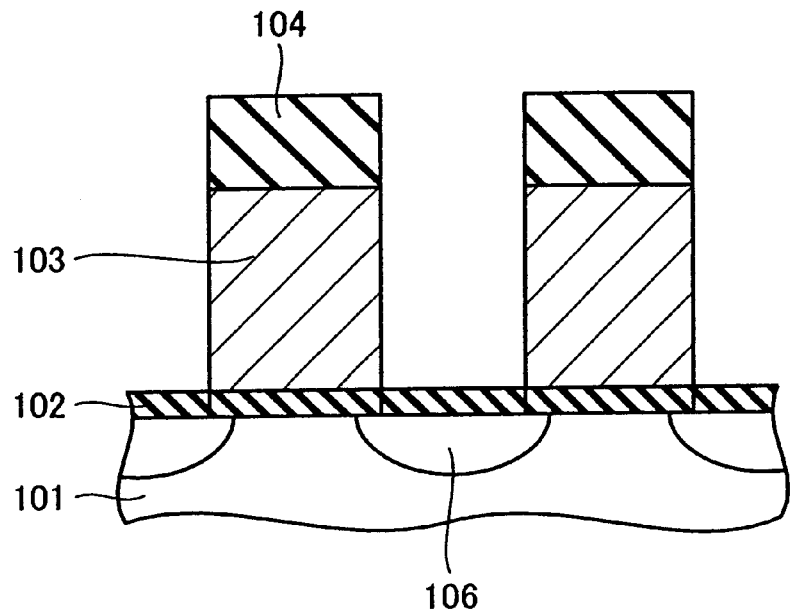
FIG. 41 is a cross sectional view at the stage wherein an impurity is introduced into source/drain regions by means of an ion implantation method.
Figure 42:
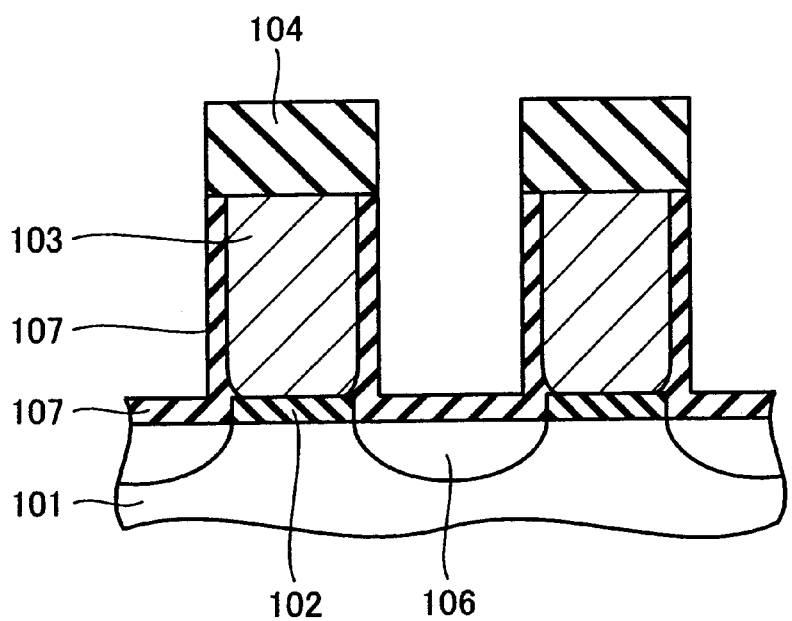
FIG. 42 is a cross sectional view at the stage wherein thermal oxide films are formed on the sides of the gate conductive layers and on the silicon substrate by means of a thermal oxidation process.
Figure 43:
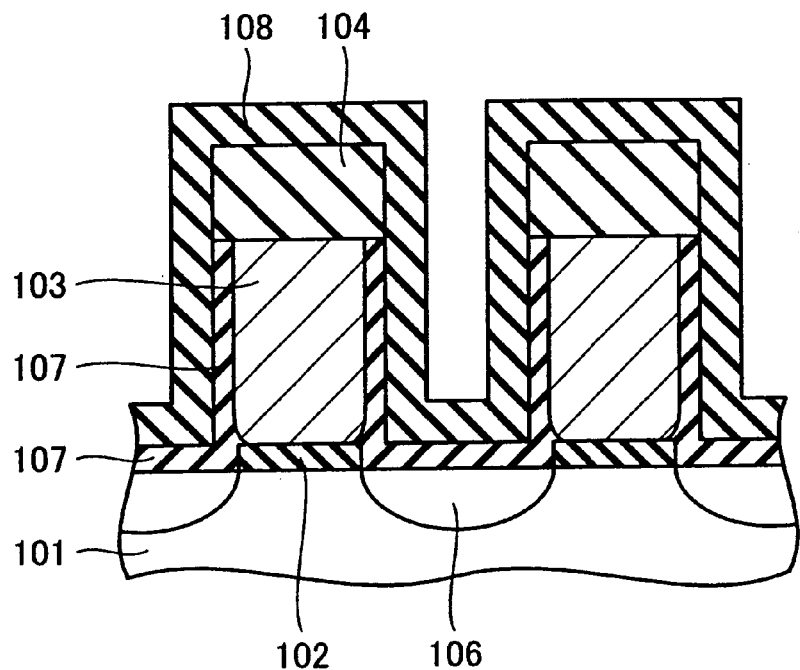
FIG. 43 is a cross sectional view at the stage wherein a protective film for the formation of sidewall external layer spacers is deposited.
Figure 44:
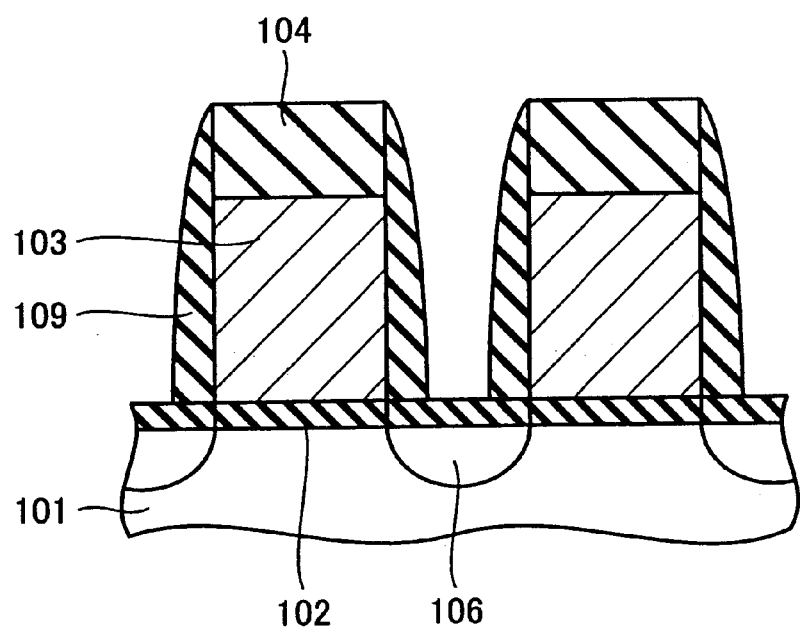
FIG. 44 is a cross sectional view showing transistors of another DRAM according to a prior art.

FIGS. 34 and 35 are cross sectional views for describing a manufacturing method for a semiconductor device according to the twentieth embodiment of the present invention. The subject of the present embodiment is a semiconductor device having a structure wherein polycrystal silicon film 10 is directly deposited on a side of a gate conductive layer. Accordingly, it is desirable for the manufacturing method of the present embodiment to be used in the case of a gate conductive layer that includes a high melting point metal layer.

In the present embodiment, in order to manufacture the above described semiconductor device, first, as shown in FIG. 30, patterning is carried out up to gate oxide film 2 so as to expose silicon substrate 1 at the time of patterning gate conductive layer 3. Next, though conventionally an impurity is introduced into source/drain regions by means of an ion implantation method, this ion implantation process is omitted in the manufacturing method of the present embodiment. After the patterning step shown in FIG. 30, polycrystal silicon film 10 doped with P, As, B, or the like, is deposited at the time of deposition of polycrystal silicon film 10, as shown in FIG. 34. Next, a thermal treatment is carried out in a nitrogen atmosphere, as shown in FIG. 35, so that the above described impurity is diffused, in the solid state, into the silicon substrate so as to form source/drain regions 6. The concentration of the above described impurity and the temperature, the period of time, and the like, of the thermal treatment can be adjusted so that the desired source/drain regions are gained.

An advantage of the manufacturing method according to the present embodiment is as follows:

(t1) In comparison with the manufacturing method of the nineteenth embodiment, the impurity can be easily diffused in the solid state because a gate oxide film or a thermal oxide film does not exist on the silicon substrate at the time when the impurity is diffused in the solid state into the silicon substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a gate conductive layer positioned on a silicon substrate;
   a stress mitigating film including a silicon film which covers a sidewall of said gate conductive layer and said silicon substrate beneath said gate conductive layer; and
   a sidewall external layer spacer covering said stress mitigating film and exposing an upper edge of the stress mitigating film in an upper portion of the sidewall of said gate conductive layer and a side edge of a bottom portion of the stress mitigating film in a lower portion of said gate conductive layer, wherein
   said stress mitigating film has silicon oxide films positioned in an area ranging inwardly from said upper edge and from said side edge so as to sandwich said silicon film from both ends.

2. The semiconductor device according to claim 1, further comprising a lower layer oxide film formed so as to directly cover the sidewall of said gate conductive layer and so as to cover a surface of said silicon substrate, wherein said stress mitigating film covers the sidewall of said gate conductive layer and said silicon substrate beneath said gate conductive layer with said lower layer oxide film interposed.

3. The semiconductor device according to claim 2, wherein said gate conductive layer is formed of a lower conductive layer, made of a silicon layer doped with an impurity, and an upper conductive layer including metal silicide while said lower layer oxide film which covers the side of said upper conductive layer thickens and bulges on a side of said metal silicide layer.

4. A semiconductor device comprising at least two gate wires including said gate conductive layer, said lower layer oxide film, said stress mitigating film and said sidewall external layer spacer included in the semiconductor device according to claim 2, wherein the gate conductive layer of one gate wire is made of an n conductive type silicon and the gate conductive layer of another gate wire is made of a p conductive type silicon.

5. The semiconductor device according to claim 1, wherein said stress mitigating film directly covers the sidewall of said gate conductive layer and covers said silicon substrate beneath said gate conductive layer.

6. The semiconductor device according to claim 1, comprising a gate protective film on said gate conductive layer, wherein said upper edge of the silicon oxide film exposes between said gate protective film and said sidewall external layer spacer.

7. The semiconductor device according to claim 6, wherein the silicon oxide film extending inwardly from said upper edge is formed up to a position which is shallower than the thickness of said gate protective film and the silicon oxide film extending inwardly from said side edge of the bottom portion is formed so as to penetrate said sidewall external layer spacer and so as to reach into said silicon film in the plan view.

8. The semiconductor device according to claim 6, wherein the silicon oxide film extending inwardly from said upper edge is formed up to the same depth as the thickness of said gate protective film, or up to a position deeper than that, and the silicon oxide film extending inwardly from said side edge of the bottom portion is formed so as to penetrate said sidewall external layer spacer and so as to reach into said silicon film in the plan view.

9. The semiconductor device according to claim 6, wherein the silicon oxide film extending inwardly from said upper edge is formed up to a position which is shallower than the thickness of said gate protective film, and the silicon oxide film extending inwardly from said side edge of the bottom portion is formed up to a position within a bottom portion of said sidewall external layer spacer in the plan view.

10. The semiconductor device according to claim 6, wherein the silicon oxide film extending inwardly from said upper edge is formed up to the same depth as the thickness of said gate protective film or up to a position deeper than that, and the silicon oxide film extending inwardly from said side edge of the bottom portion is formed up to a position within a bottom portion of said sidewall external layer spacer in the plan view.

11. The semiconductor device according to claim 6, wherein the silicon oxide film extending inwardly from said upper edge is formed up to a position that is shallower than the thickness of said gate protective film and the silicon oxide film extending inwardly from said side edge of the bottom portion is formed so as to penetrate said sidewall external layer spacer and said silicon film in the plan view.

12. The semiconductor device according to claim 6, wherein the silicon oxide film extending inwardly from said upper edge is formed up to the same depth as the thickness of said gate protective film or up to a position deeper than that, and the silicon oxide film extending inwardly from said side edge of the bottom portion is formed so as to penetrate said sidewall external layer spacer and said silicon film in the plan view.

13. The semiconductor device according to claim 1, wherein said silicon film is formed of silicon doped with an impurity.

14. The semiconductor device according to claim 1, wherein said gate conductive layer is formed of a lower conductive layer, made of a silicon layer doped with an impurity, and an upper conductive layer including metal suicide.

* * * * *